(12) United States Patent
Yoshida et al.

(10) Patent No.: US 9,972,536 B2
(45) Date of Patent: May 15, 2018

(54) RECONFIGURABLE SEMICONDUCTOR DEVICE

(71) Applicant: Taiyo Yuden Co., Ltd., Tokyo (JP)

(72) Inventors: Hideaki Yoshida, Tokyo (JP);
Mitsunori Katsu, Tokyo (JP);
Hiroyuki Kozutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days. days.

(21) Appl. No.: 15/517,726

(22) PCT Filed: Oct. 6, 2015

(86) PCT No.: PCT/JP2015/078311
§ 371 (c)(1),
(2) Date: Apr. 7, 2017

(87) PCT Pub. No.: WO2016/056536
PCT Pub. Date: Apr. 14, 2016

(65) Prior Publication Data
US 2017/0301587 A1    Oct. 19, 2017

(30) Foreign Application Priority Data
Oct. 8, 2014    (JP) .................................. 2014-206853

(51) Int. Cl.
*H03K 19/177*    (2006.01)
*H01L 21/82*     (2006.01)
(Continued)

(52) U.S. Cl.
CPC .......... *H01L 21/82* (2013.01); *G01R 31/2884* (2013.01); *G01R 31/318516* (2013.01);
(Continued)

(58) Field of Classification Search
CPC ....... H03K 19/17724; H03K 19/17728; H03K 19/17736; H03K 19/17744;
(Continued)

(56) References Cited

U.S. PATENT DOCUMENTS 5,321,845 A    6/1994 Sawase et al.
5,428,808 A    6/1995 Sawase et al.
(Continued)

FOREIGN PATENT DOCUMENTS

CN    104737450 A      6/2015
DE    102013012790 A1  2/2014
(Continued)

*Primary Examiner* — Jason M Crawford
(74) *Attorney, Agent, or Firm* — Chip Law Group

(57) ABSTRACT

A reconfigurable device and an analog circuit are formed on a single chip so that the analog circuit can be controlled by the reconfigurable device. A reconfigurable semiconductor device (1) includes a plurality of logic sections (20) and an analog section (10). The plurality of logic sections (20) are connected to each other by an address line or a data line. The analog section (10) includes a plurality of input/output sections and an output amplifier. Each of the logic sections (20) includes a plurality of address lines, a plurality of data lines, a memory cell unit, and an address decoder that decodes an address signal and that outputs a decoded signal to the memory cell unit. The plurality of logic sections (20) and the analog section (10) are mounted in the same chip package.

17 Claims, 17 Drawing Sheets

(51) Int. Cl.
*G01R 31/28* (2006.01)
*G06F 17/50* (2006.01)
*G11C 11/4076* (2006.01)
*G11C 11/408* (2006.01)
*G01R 31/3185* (2006.01)

(52) U.S. Cl.
CPC ...... G06F 17/5027 (2013.01); G11C 11/4076 (2013.01); G11C 11/4082 (2013.01); H03K 19/177 (2013.01)

(58) Field of Classification Search
CPC .............. H03K 19/17748; H01L 21/82; G06F 17/5027; G06F 17/5054; G06F 9/30; G06F 9/30145
See application file for complete search history.

(56) References Cited

U.S. PATENT DOCUMENTS

| | | | |
|---|---|---|---|
| 5,784,637 A | 7/1998 | Sawase et al. | |
| 7,352,206 B1* | 4/2008 | Zhu | G01K 7/015 326/38 |
| 2002/0108006 A1* | 8/2002 | Snyder | G06F 1/08 710/100 |
| 2009/0058462 A1* | 3/2009 | Mason | G06F 17/5027 326/38 |
| 2014/0042950 A1 | 2/2014 | Aoyama et al. | |
| 2015/0022232 A1* | 1/2015 | Satou | H03K 19/1776 324/762.01 |
| 2015/0042377 A1* | 2/2015 | Satou | H03K 19/17732 326/16 |
| 2016/0240243 A1* | 8/2016 | Satou | G11C 8/18 |
| 2016/0322974 A1* | 11/2016 | Satou | H03K 19/1776 |

FOREIGN PATENT DOCUMENTS

| | | |
|---|---|---|
| EP | 0306962 A2 | 3/1989 |
| JP | 01162971 A | 6/1989 |
| JP | 2013219699 A | 10/2013 |
| JP | 2014035564 A | 2/2014 |
| TW | 201417502 A | 5/2014 |
| WO | 2014065424 A1 | 5/2014 |

* cited by examiner

Local Bus(16bit)

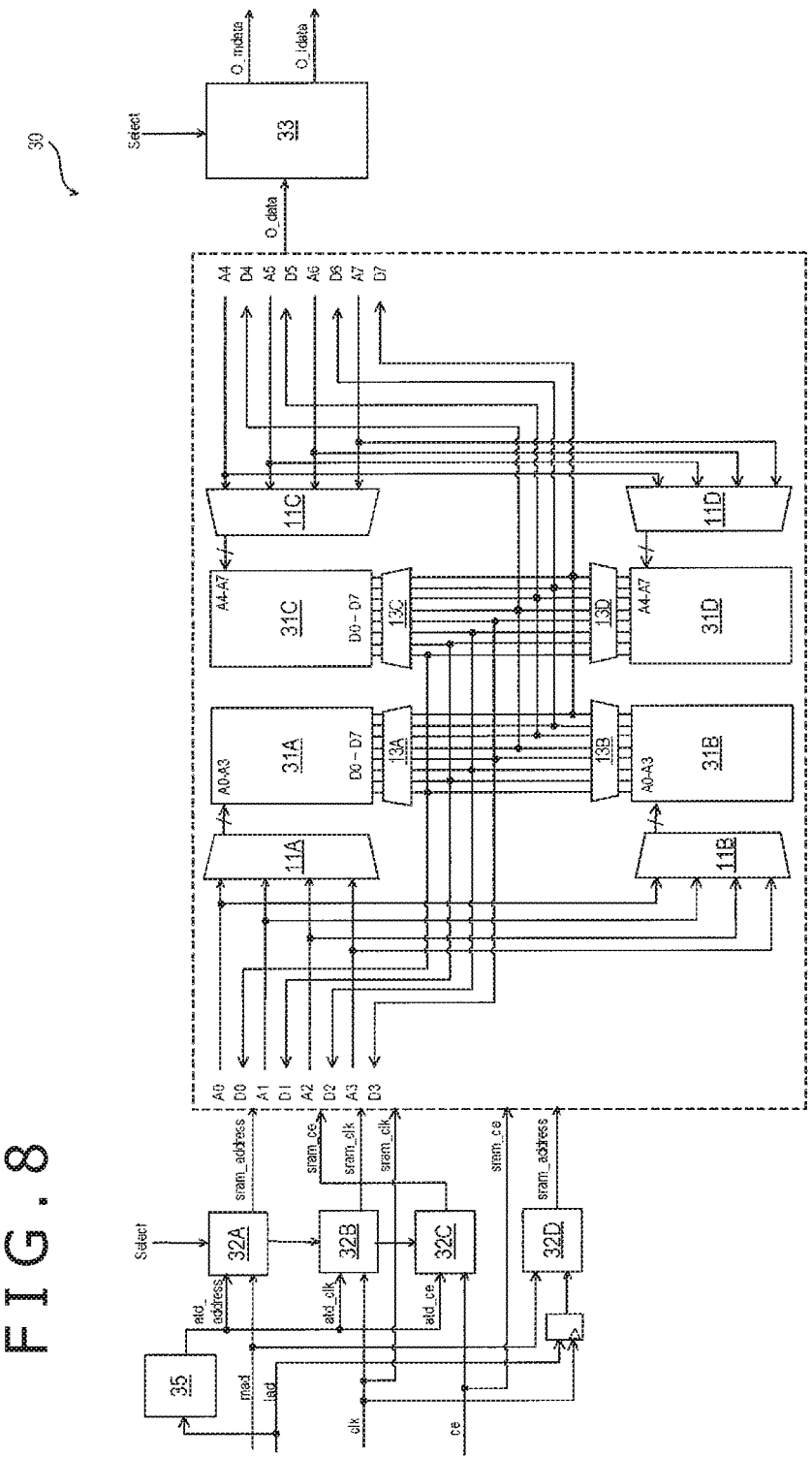
F I G . 8

FIG.12
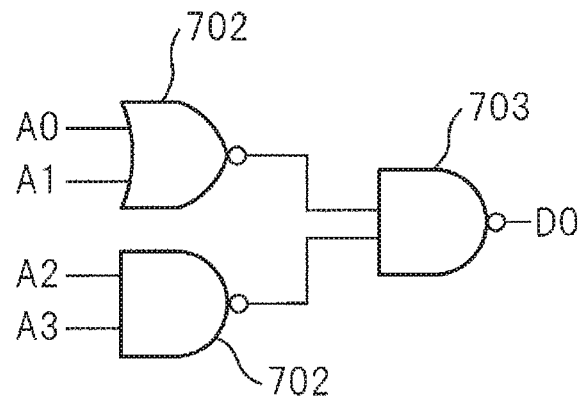
FIG.13
[truth table]
FIG.14
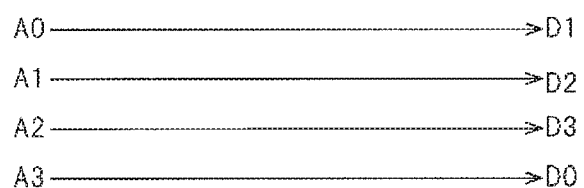

FIG.15
| A0 | A1 | A2 | A3 | D0 | D1 | D2 | D3 |
|----|----|----|----|----|----|----|----|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |
FIG.16
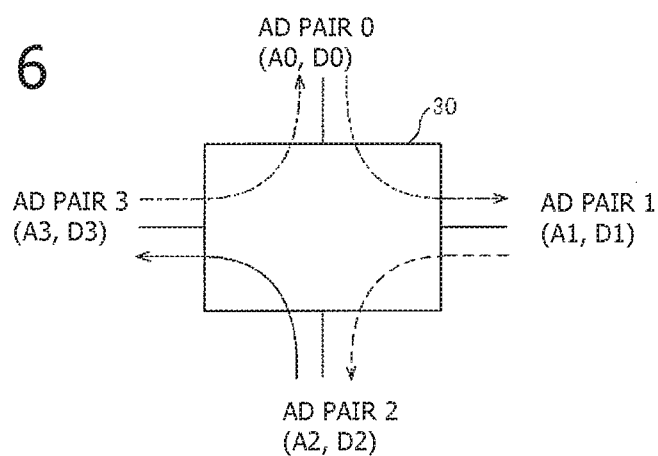
FIG.17
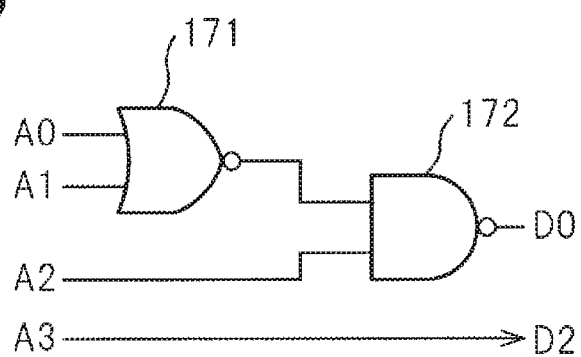

FIG.18
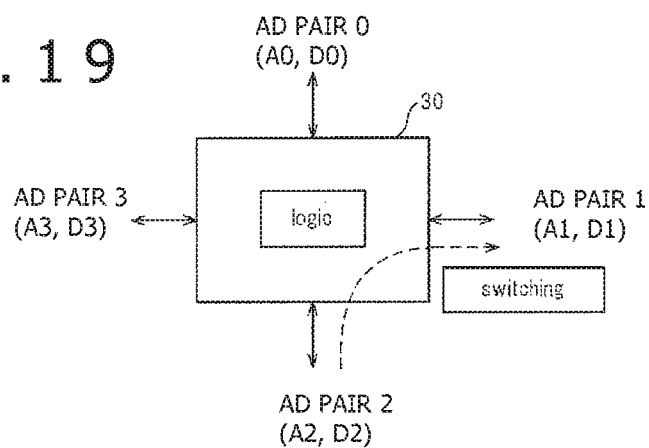
FIG.19
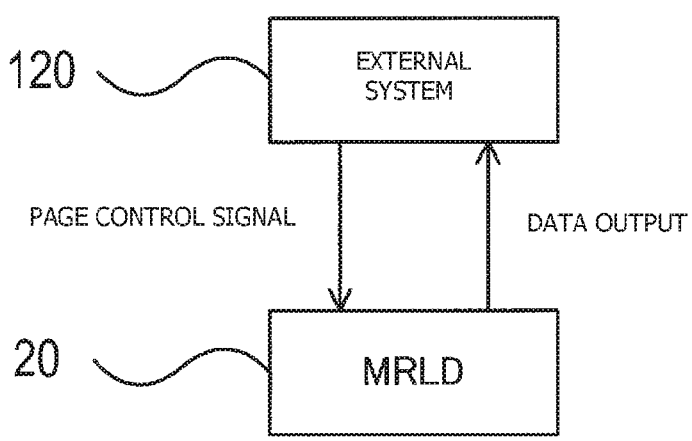
FIG.20

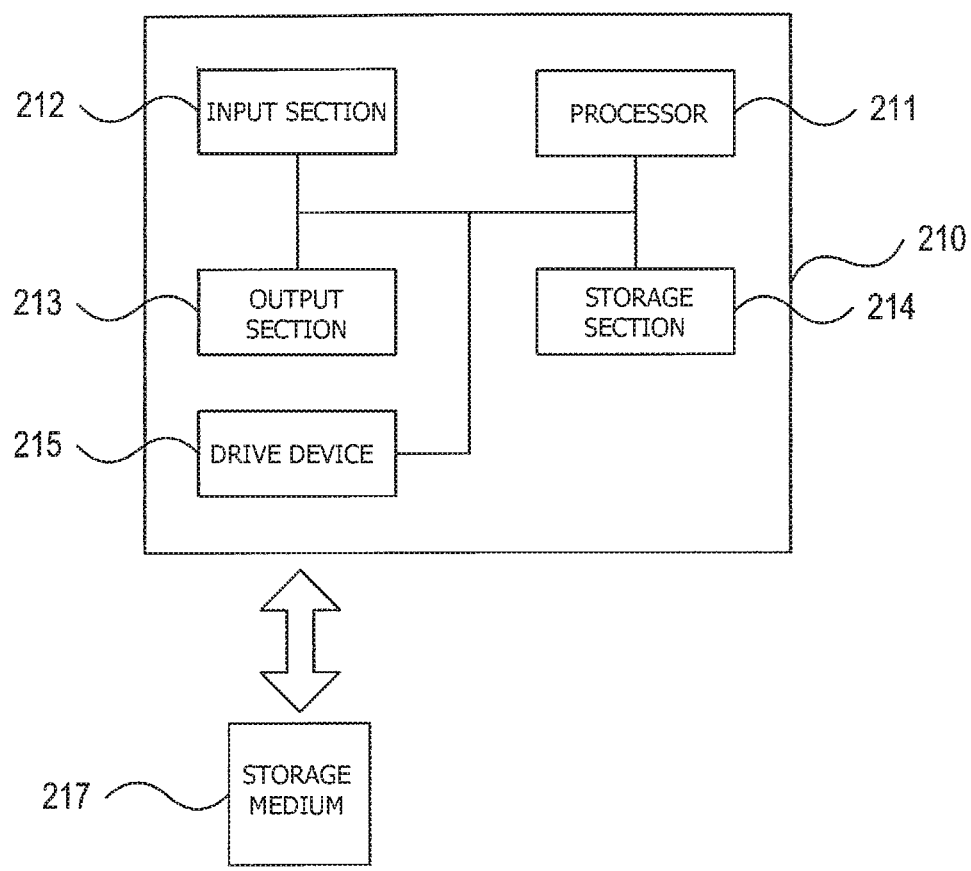
F I G . 2 1

RECONFIGURABLE SEMICONDUCTOR DEVICE

CROSS REFERENCE TO RELATED APPLICATIONS

This application is a U.S. National Phase of International Patent Application No. PCT/JP2015/078311 filed on Oct. 6, 2015, which claims priority benefit of Japanese Patent Application No. JP 2014-206853 filed in the Japan Patent Office on Oct. 8, 2014. Each of the above-referenced applications is hereby incorporated herein by reference in its entirety.

TECHNICAL FIELD

The present invention relates to a reconfigurable semiconductor device.

BACKGROUND ART

In recent years, system-on-a-chip (SoC) that integrates most of the system onto a single large scale integration (LSI) has become widespread because of high packing density achieved by miniaturization of semiconductor manufacturing processes. Comparing SoC with a plurality of single function LSIs mounted on a substrate, SoC offers a number of advantages including reduced footprint on a printed circuit board, higher speed, lower power consumption, and reduced cost.

For example, a system-on-a-chip has been proposed that includes a hard macro block, a power control section, and a multi-threshold complementary metal oxide semiconductor (CMOS) logic circuit (PTL 1). The system-on-a-chip can reduce leak current in the system-on-a-chip as a whole by powering off the hard macro block.

CITATION LIST

Patent Literature

[PTL 1]
JP 2013-219699A

SUMMARY

Technical Problem

Recent years have seen increasing miniaturization of reconfigurable devices such as field-programmable gate array (FPGA). An analog circuit needs higher operating voltage and current than a semiconductor device, making it more difficult to miniaturize the analog circuit. In FPGA and so on where miniaturization is particularly advanced, an analog circuit cannot be mounted on the same chip, making it necessary to provide an analog circuit externally. On the other hand, if a system including a semiconductor device and an analog circuit are integrated onto a single chip as SoC or the like, circuit design is necessary each time revision of the analog circuit or other circuit is necessary.

Embodiments for solving the above problem permit formation of a reconfigurable device and an analog circuit on a single chip and controlling of the analog circuit with the reconfigurable device as given below by the following set of items.

[Item 1]
A reconfigurable semiconductor device including:
a plurality of logic sections that are connected to each other by an address line or a data line; and
an analog section including a plurality of input/output sections and an output amplifier, in which
each of the logic sections includes
a plurality of address lines,
a plurality of data lines,
a memory cell unit, and
an address decoder adapted to decode an address signal and output a decoded signal to the memory cell unit, and
the plurality of logic sections and the analog section are mounted in the same chip package.

[Item 2]
The semiconductor device of item 1, further including:
a processor, in which
the plurality of logic sections, the analog section, and the processor are connected to each other via a bus, and
as configuration data is written to the memory cell unit, the plurality of logic sections reconfigure a logic circuit and execute part of functionality of the processor by the configuration data.

[Item 3]
The semiconductor device of item 1 or item 2, in which
the processor retains the configuration data and outputs the retained configuration data to the plurality of logic sections to reconfigure the plurality of logic sections.

[Item 4]
The reconfigurable semiconductor device of any one of item 1 to item 3, in which
the memory cell unit controls or sets the analog section as an interconnection element and/or a logic element configured by truth table data.

[Item 5]
The reconfigurable semiconductor device of any one of item 1 to item 4, in which
the analog section includes a digital input/output, a level shifter circuit, and an amplifier, and
the analog line and an output of the level shifter circuit are connected, and the data line and an input of the amplifier are connected.

[Item 6]
The reconfigurable semiconductor device of any one of item 1 to item 5, in which
the memory cell unit operates as a multi-lookup table.

[Item 7]
The reconfigurable semiconductor device of any one of item 2 to item 6, in which
the analog section includes a first digital input, a second digital input, a first amplifier, and a second amplifier, and
the truth table data connects either of the digital inputs and either of the amplifiers.

[Item 8]
The reconfigurable semiconductor device of any one of item 1 to item 7, in which
each of the logic sections includes
a plurality of address lines,
a plurality of data lines,
a clock signal line adapted to receive a system clock signal,
a first memory cell unit and a second memory cell unit adapted to operate in synchronism with a clock signal,
a first address decoder adapted to decode an address signal and output a decoded signal to the first memory cell unit, a second address decoder adapted to decode an address signal and output a decoded signal to the second memory cell unit, and an address transition detection section adapted to generate an internal clock signal and output the internal clock signal to the first memory cell unit when a transition of an address signal input from the plurality of address lines is detected, the first memory cell unit operates in synchronism with the internal clock signal, and the second memory cell unit operates in synchronism with the system clock signal.

[Item 9]

The reconfigurable semiconductor device of any one of item 1 to item 8, in which a data line connected to the first memory cell unit and a data line connected to the second memory cell unit are connected to each other to output a logical sum, and if either of the memory cell units is not used, 0s are written for all to the unused memory cell unit.

[Item 10]

The reconfigurable semiconductor device of item 8 or item 9, further including:

a third memory cell unit and a fourth memory cell unit adapted to operate in synchronism with a clock signal;

a third address decoder adapted to decode an address signal and output a decoded signal to the third memory cell unit; and a fourth address decoder adapted to decode an address signal and output a decoded signal to the fourth memory cell unit, in which the third memory cell unit operates in synchronism with the internal clock signal, the fourth memory cell unit operates in synchronism with the system clock signal, the first address decoder and the second address decoder decode an address input from part of the plurality of address lines, and the third address decoder and the fourth address decoder decode an address input from other part of the plurality of address lines.

[Item 11]

The reconfigurable semiconductor device of item 10, storing truth table data configured not to generate a logic operation that spreads over the first memory cell unit and the third memory cell unit as an inhibit logic.

[Item 12]

A control method of a reconfigurable semiconductor device, the semiconductor device including:

a plurality of logic sections that are connected to each other by an address line or a data line; and an analog section including a plurality of input/output sections and an output amplifier, in which each of the logic sections includes a plurality of address lines, a plurality of data lines, a memory cell unit, and an address decoder adapted to decode an address signal and output a decoded signal to the memory cell unit, the plurality of logic sections and the analog section are mounted in the same chip package, the analog section has a first digital input, a second digital input, a first amplifier, and a second amplifier, each of the logic sections includes a plurality of address lines, a plurality of data lines, a clock signal line adapted to receive a system clock signal, a first address decoder, and a first memory cell unit having a plurality of memory cells and adapted to operate in synchronism with a clock signal, the first address decoder decodes the address signal and outputs a decoded signal to the first memory cell unit, and truth table data retained by the first memory cell unit connects either of the digital inputs and either of the amplifiers.

[Item 13]

The control method of a reconfigurable semiconductor device of item 12, in which the logic section includes a second address decoder, a second memory cell unit including a plurality of memory cells and adapted to operate in synchronism with a clock signal, an address transition detection section adapted to generate an internal clock signal and output the internal clock signal to the first memory cell unit when a transition of an address signal input from the plurality of address lines is detected, the second address decoder decodes the address signal and outputs a decoded signal to the second memory cell unit, the first memory cell unit operates in synchronism with the internal clock signal, and the second memory cell unit operates in synchronism with the system clock signal.

[Item 14]

The control method of a reconfigurable semiconductor device of item 13, further including:

a third memory cell unit and a fourth memory cell unit adapted to operate in synchronism with a clock signal;

a third address decoder adapted to decode an address signal and output a decoded signal to the third memory cell unit; and a fourth address decoder adapted to decode an address signal and output a decoded signal to the fourth memory cell unit, the third memory cell unit operates in synchronism with the internal clock signal, the fourth memory cell unit operates in synchronism with the system clock signal, in which the first address decoder and the second address decoder decode an address input from part of the plurality of address lines, and the third address decoder and the fourth address decoder decode an address input from other part of the plurality of address lines.

[Item 15]

The reconfigurable semiconductor device of any one of item 12 to item 14, in which the memory cell unit stores truth table data that configures an interconnection element and/or a logic element to operate as a multi-lookup table.

[Item 16]

A program for controlling a reconfigurable semiconductor device, the semiconductor device including:

a plurality of logic sections that are connected to each other by an address line or a data line; and an analog section having a plurality of input/output sections and an output amplifier, in which each of the logic sections includes
a plurality of address lines,
a plurality of data lines,
a memory cell unit, and
an address decoder adapted to decode an address signal and output a decoded signal to the memory cell unit,
the plurality of logic sections and the analog section are mounted in the same chip package,
the analog section includes a first digital input, a second digital input, a first amplifier, and a second amplifier,
each of the logic sections includes
a plurality of address lines,
a plurality of data lines,
a clock signal line adapted to receive a system clock signal,
a first address decoder, and
a first memory cell unit having a plurality of memory cells and adapted to operate in synchronism with a clock signal, the program causing truth table data retained by the first memory cell unit to perform a process of connecting either of the digital inputs and either of the amplifiers.

[Item 17]

A storage medium storing the program of item 16.

Advantageous Effect of the Invention

In one embodiment of the present invention, a synchronous/asynchronous switchable and reconfigurable semiconductor device is realized using a synchronous memory.

BRIEF DESCRIPTION OF DRAWINGS

FIG. 8 is a diagram illustrating a circuit example of a synchronous/asynchronous switchable MLUT.

FIG. 12 is a diagram illustrating an example of an MLUT that operates as a logic circuit.

FIG. 13 is a diagram illustrating a truth table of the logic circuit illustrated in FIG. 12.

FIG. 14 is a diagram illustrating an example of an MLUT that operates as a connection element.

FIG. 15 is a diagram illustrating a truth table of the connection element illustrated in FIG. 14.

FIG. 16 is a diagram illustrating an example of a connection element realized by an MLUT having four AD pairs.

FIG. 17 is a diagram illustrating an example of a single MLUT that operates as a logic element and as a connection element.

FIG. 18 illustrates a truth table of the logic element and the connection element illustrated in FIG. 17.

FIG. 19 is a diagram illustrating an example of a logic operation and a connection element realized by an MLUT having AD pairs.

FIG. 20 is a conceptual diagram illustrating an example of connection between an external system and an MRLD.

FIG. 21 illustrates an example of a hardware configuration of an information processing device.

DESCRIPTION OF EMBODIMENTS

A reconfigurable semiconductor device will be described below with reference to drawings based on the following configuration. A description will be given in the order: 1. MRLD Chip, 2. MRLD, 3. MLUT, 4. Synchronous/Asynchronous MLUT, 5. MLUT Logic Operation, and 6. Truth Table Data Generation Method.

1. MRLD Chip

A reconfigurable logic device is referred to as a memory based reconfigurable logic device (MRLD) (registered trademark). MRLD is common to "memory-based programmable logic device (MPLD)" (registered trademark) in which the circuit configuration is realized by memory cell units in that MLUTs are directly connected with no interconnection elements therebetween but is distinguished from MPLD in that functionality of a synchronous static random access memory (SRAM) supplied as a memory Internet protocol (IP) is put to effective use.

Figure 1A:
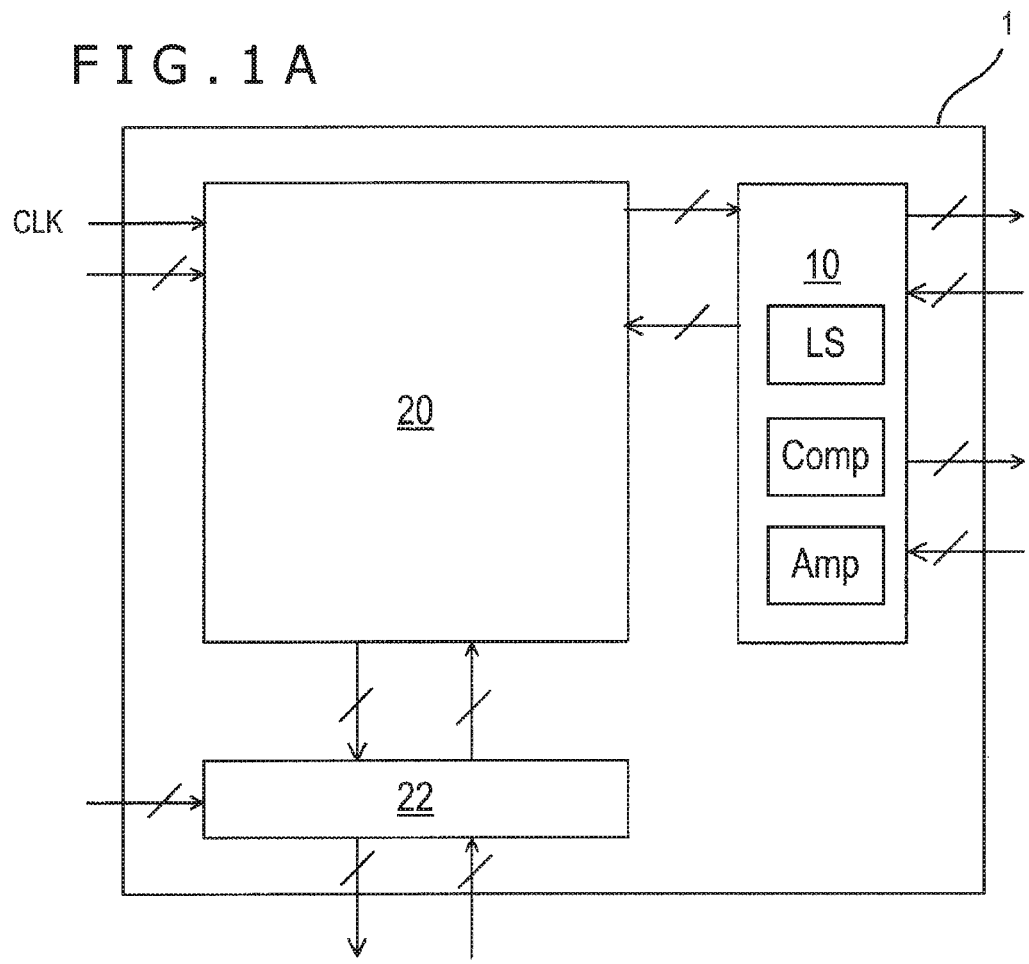
FIG. 1A is a floor plan illustrating an example of an MRLD chip according to the present embodiment.

FIG. 1A is a floor plan illustrating an example of an MRLD chip according to the present embodiment. An MRLD chip 1 (hereinafter referred to as an "MRLD chip") having an analog circuit illustrated in FIG. 1A includes a plurality of logic sections 20 and an analog section 10. The plurality of logic sections 20 are connected to each other by address lines or data lines. The analog section 10 has a plurality of input/output sections and an output amplifier. Each of the logic sections 20 includes a plurality of address lines, a plurality of data lines, a memory cell unit, and an address decoder that decodes an address signal and that outputs a decoded signal to the memory cell unit. The plurality of logic sections and the analog section are mounted in the same chip package. It should be noted that the logic sections 20 are the MRLDs 20.

Figure 1B:
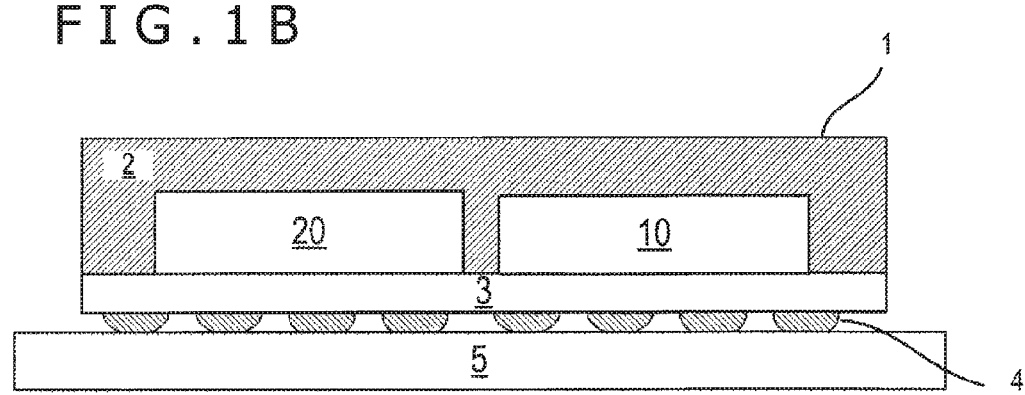
FIG. 1B is a sectional view illustrating an example of an MRLD chip according to the present embodiment.

FIG. 1B is a sectional view illustrating an example of an MRLD chip according to the present embodiment. The MRLD 20 and the analog section 10 are covered by resin 2 and placed on an interposer substrate 3. The MRLD 20 and the analog section 10 are electrically connected via substrate electrodes and gold wires on the interposer substrate 3. The interposer substrate 3 is further placed on a printed circuit board 5 via external terminals 4.

Various functions of semiconductor devices are realized by integrated circuits formed on a silicon chip through complicated processes. The silicon chip is extremely delicate and may become non-functional due to a slight amount of dust or moisture. Also, light may cause malfunction. In order to avoid these problems, the silicon chip is protected by a package.

Although semiconductor manufacturing process is moving toward miniaturization, manufacturing of the MRLD chip 1 having an analog circuit according to the present embodiment is carried out by a semiconductor manufacturing process that also permits analog circuit manufacturing. Therefore, integration into a single chip is achieved at the expense of miniaturization effects, offering single chip integration effects and contributing to reduced burden involved in analog circuit design.

Referring back to FIG. 1A, the analog section 10 has a level shifter (LS), a comparator (Comp), and an amplifier (Amp). The level shifter is controlled by two supply voltages that are not depicted, and addition of each of the supply voltages to an input voltage enables voltage to increase or decrease. The comparator is an element that compares magnitudes of two voltages and outputs a different value depending on the comparison result. The comparator has two input terminals. When an analog voltage is applied to each of the input terminals, an output value changes depending on which input voltage is greater. A plurality of circuits may be combined in the analog section 10 such as providing a level shifter at an exit of the comparator or providing a level shifter at an entrance of the amplifier.

The MRLD chip 1 further has a configuration unit 22. The configuration unit 22 has a function to read configuration data from or write configuration data to the MRLD 20.

Figure 2A:
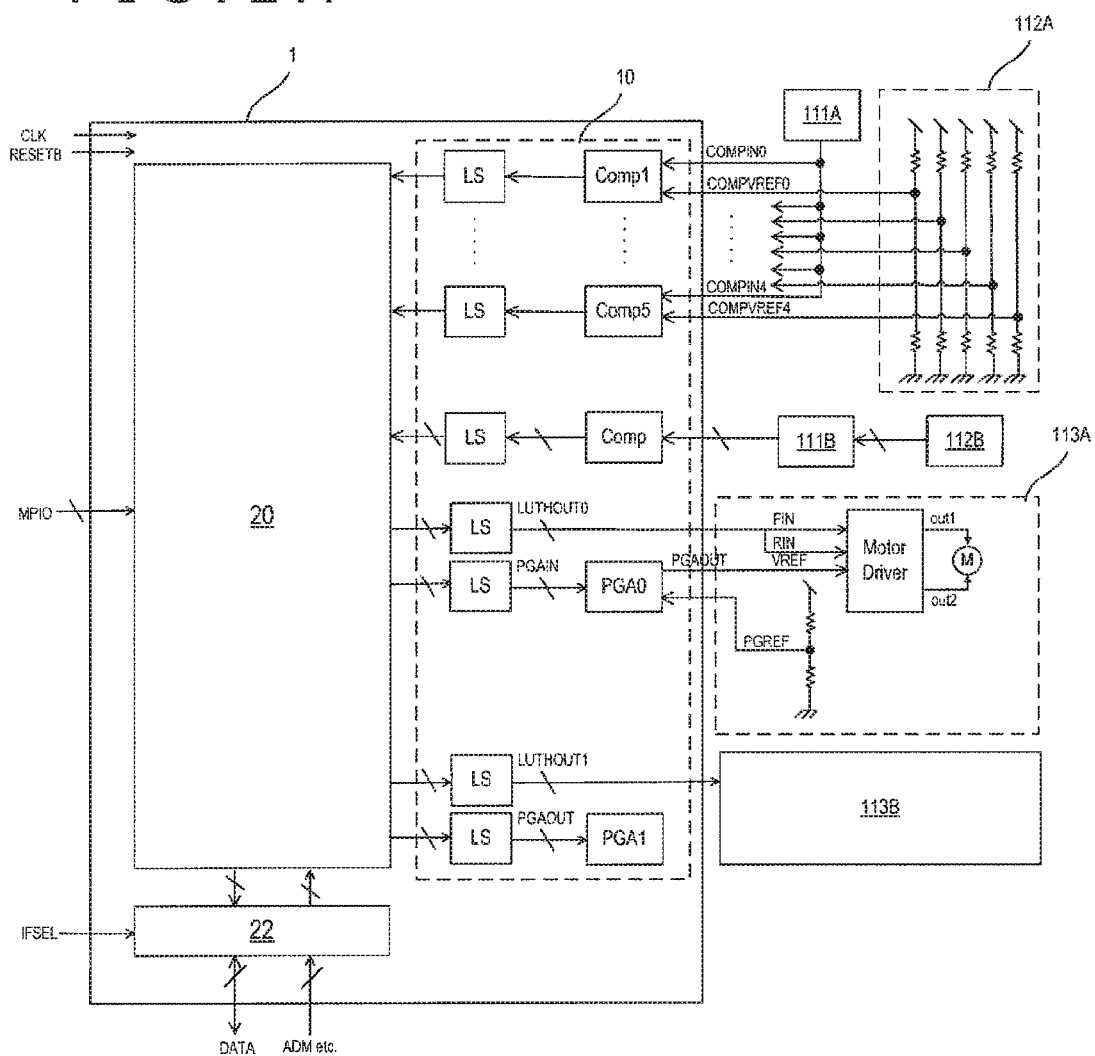
FIG. 2A is a first example of a floor plan illustrating a detailed example of an MRLD chip with an analog circuit.

FIG. 2A is a floor plan illustrating a detailed example of an MRLD chip with an analog circuit according to the present embodiment. Table 1 depicted below illustrates signal names and terminal functionality of the MRLD chip 1 illustrated in FIG. 2A. The MRLD 20 illustrated in FIG. 2A has 12 by 12 MLUTs (which will be described later). The analog section 10 of the MRLD chip 1 has a plurality of level shifters (LS), a plurality of comparators (Comp), a plurality of programmable gain amplifiers (PGA), and other analog circuits. The analog section 10 has a 5-V analog power supply, a 1.8-V logic power supply, a 0-V ground, and 144 pins.

The MLUTs have two 16-word×8-bit memory cell units for synchronous and asynchronous operation. The configuration unit 22 inputs configuration data from an external terminal bus and writes the configuration data individually to the MLUTs.

Distance sensors 111, voltage dividers 112 for comparator VREF, and motor drivers 113 are provided outside the MRLD chip 1. The MRLD chip 1 receives inputs of the external devices (distance sensors 111 and voltage dividers 112 for comparator VREF) with the analog section 10 and adjusts signal voltages with the level shifters, after which the MRLD 20 receives the inputs as an address signal. Also, the MRLD chip 1 amplifies a data output signal of the MRLD 20 with the PGAs and outputs the signal to the motor drivers 113.

TABLE 1

| Signal Name | Bit Width | Input/Output | Terminal Function | Description | |
|---|---|---|---|---|---|
| [system] | | | | | |
| CLK | 1 | I | PD | Logic Sync Clock/Config Clock | 1.8 V system |
| RESETB | 1 | I | PU | Hard Reset-Config Circuit | 1.8 V system |
| [Mode Control] | | | | | |
| MLCTRL | 1 | I | PU | MRLD Operation Mode 1 = Config 0 = User | 1.8 V system |
| [MRLD Configuration Control/Address/Data] | | | | | |
| OEN | 1 | I | PU | Read Enable 1 = Data Input 0 = Data Output | 1.8 V system |
| WEN | 1 | I | PU | Write Enable 1 = diable 0 = Write | 1.8 V system |
| ADC<3:0> | 4 | I | PD | Configuration Column Address | 1.8 V system |
| ADR<3:0> | 4 | I | PD | Configuration Row Address | 1.8 V system |
| ADM<5:0> | 6 | I | PD | Configuration LUT Address | 1.8 V system |
| DATA<7:0> | 8 | IO | PD | Configuration Data | 1.8 V system |
| MPIO_T | 13 | IO | PD | MRLD Logic Operation Terminal (Top) | 1.8 V system |
| MPIO_L | 22 | IO | PD | MRLD Logic Operation Terminal (Left) | 1.8 V system |
| MPIO_B | 13 | IO | PD | MRLD Logic Operation Terminal (Bottom) | 1.8 V system |
| LUTIN | 1 | I | PD | LUT Terminal Input 1.8 V system | 5 V system |
| LUTOUT | 1 | O | | LUT Terminal Output 1.8 V system | 5 V system |
| LUTHIN<5:0> | 6 | I | PD | LUT Terminal Input 5 V system | 5 V system |
| LUTHOUT<5:0> | 6 | O | | LUT Terminal Output 5 V system | 5 V system |
| [Auto config] | | | | | |
| SCL | 1 | O | | I2C Clock | 1.8 V system |
| SDA | 1 | IO | | I2C Data | 1.8 V system |

TABLE 1-continued

| Signal Name | Bit Width | Input/Output | Terminal Function | Description | |
|---|---|---|---|---|---|
| IFCLK | 1 | I | PD | I2C IF Clock | 1.8 V system |
| IFSEL | 1 | I | PD | Parallel or I2C Use Select 0 = Parallel 1 = I2C | 1.8 V system |
| CONFDONE | 1 | O | | Config End Signal | 1.8 V system |
| CONFSTART | 1 | I | PD | AUTO Config Start | 1.8 V system |
| [Analog] | | | | | |
| INLS0 | 1 | I | | Level Shifter Input 1.8 V system | 1.8 V system |
| INLS1 | 1 | I | | Level Shifter Input 5 V system | 5 V system |
| OUTLS0 | 1 | O | | Level Shifter Output 5 V system | 5 V system |
| OUTLS1 | 1 | O | | Level Shifter Output 1.8 V system | 1.8 V system |
| COMPIN<4:0> | 5 | I | | Comparator Input | 5 V system |
| COMPVREF<4:0> | 5 | I | | Comparator Reference Input | 5 V system |
| COMPOUT<4:0> | 5 | O | | Comparator Output | 5 V system |
| PGAIN | 1 | I | | Programmable Gain Amp Input | 5 V system |
| PGAOUT | 1 | O | | Programmable Gain Amp Output | 5 V system |
| PGREF | 1 | I | | Programmable Gain Amp Reference Input | 5 V system |
| PGGAIN<2:0> | 3 | I | | Programmable Gain Amp Gain Set | 5 V system |
| PG_EN | 1 | I | PD | Programmable Gain Amp Enable 0 = off 1 = ON | 5 V system |
| COMP_EN | 1 | I | PD | Comparator Enable 0 = off 1 = ON | 5 V system |
| [Power] | | | | | |
| VDDL | 7 | | | Core Power Supply 1.8 V | |
| VDDH | 3 | | | Analog Power Supply 5 V | |
| VSSL | 7 | | | Core GND 1.8 V | |
| VSSH | 3 | | | Analog GND 5 V | |
| N.C | 2 | | | NC | |
| TOTAL | 144 | | | | |

Figure 2B:
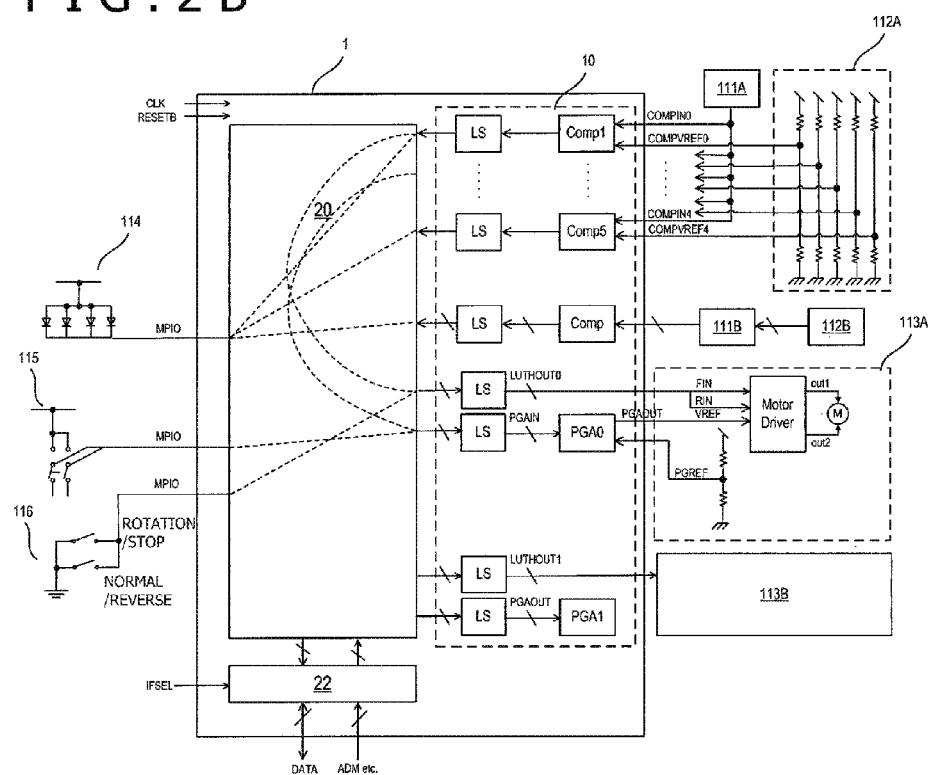
FIG. 2B is a diagram illustrating an operation example of the MRLD chip illustrated in FIG. 2A.

FIG. 2B is a diagram illustrating an operation example of the MRLD chip illustrated in FIG. 2A. The distance sensors 111 are provided externally. Functionality of the MRLD chip 1 will be described below using an operation example.

In FIG. 2B, a status indicating light emitting diode (LED) 114, a motor rotation speed setting circuit 115, and a motor rotation control switch 116 are provided outside the MRLD chip 1 in addition to the example illustrated in FIG. 2A.

Distance Sensor Control (Indicated by Signal Lines in Dotted Lines)

The MRLD can monitor a distance sensor output using built-in comparators.

Further, each voltage is input to a VREF of the comparator from the voltage divider 112 for comparator VREF provided outside the MRLD chip 1. The output of the distance sensor 111 is connected to the inputs of all the comparators. The distance sensor 111 outputs a voltage. The voltage is compared against each VREF, and the comparator outputs "H" or "L." The signal passes through a 5V to 1.8V level shifter and is input to the MRLD 20. The MRLD 20 outputs the signal to an MPIO_x (where x is the terminal used), lighting up the LED 114.

Motor Driver Control (Indicated by Signal Lines in Dotted Lines)

The OR logic of the comparator outputs input to the MRLD 20 is generated inside the MRLD 20 to control on/off of the motor driver 113. The motor driver 113 performs pulse width modulation (PWM) control by a VREF value. The VREF to the motor driver is set using the PGA built into the MRLD chip 1. A 3-bit signal is input from the MPIO_x, and the signal passes through a 1.8-V to 5-V level shifter from the MRLD 20 to set a PGA gain. The gain can be set to one-fold, two-fold, five-fold, or ten-fold.

A motor speed can be changed by inputting a fixed voltage to the PGA input (PGAIN), setting a gain for the PGA input, and varying the PGAOUT voltage. Motor rotation ON/OFF and normal/reverse rotation control are also input from the MPIO_x, undergo a logical operation with the comparator output in the MRLD, and are input to a control terminal (FIN/RIN) of the motor driver via the 1.8V to 5V level shifter.

This allows the output of the motor driver 113 to be controlled using the input of the distance sensor 111. In addition, as indicated by dotted lines in FIG. 2B, it is possible to switch to operation control from the distance sensor 111A to the motor driver 113A, from the distance sensor 111A to the motor driver 113B, from the distance sensor 111B to the motor driver 113A, or from the distance sensor 111B to the motor driver 113B by reconfiguring the MRLD 20. Further, it is possible to perform simultaneous operation not only from the distance sensor 111A to the motor driver 113A and from the distance sensor 111B to the motor driver 113B but also from the distance sensor 111A to the motor driver 113B and from the distance sensor 111B to the motor driver 113A.

Thus, reconfiguration functionality of the analog section 10 is provided simply by changing the configuration data of the MRLD 20.

Figure 2C:
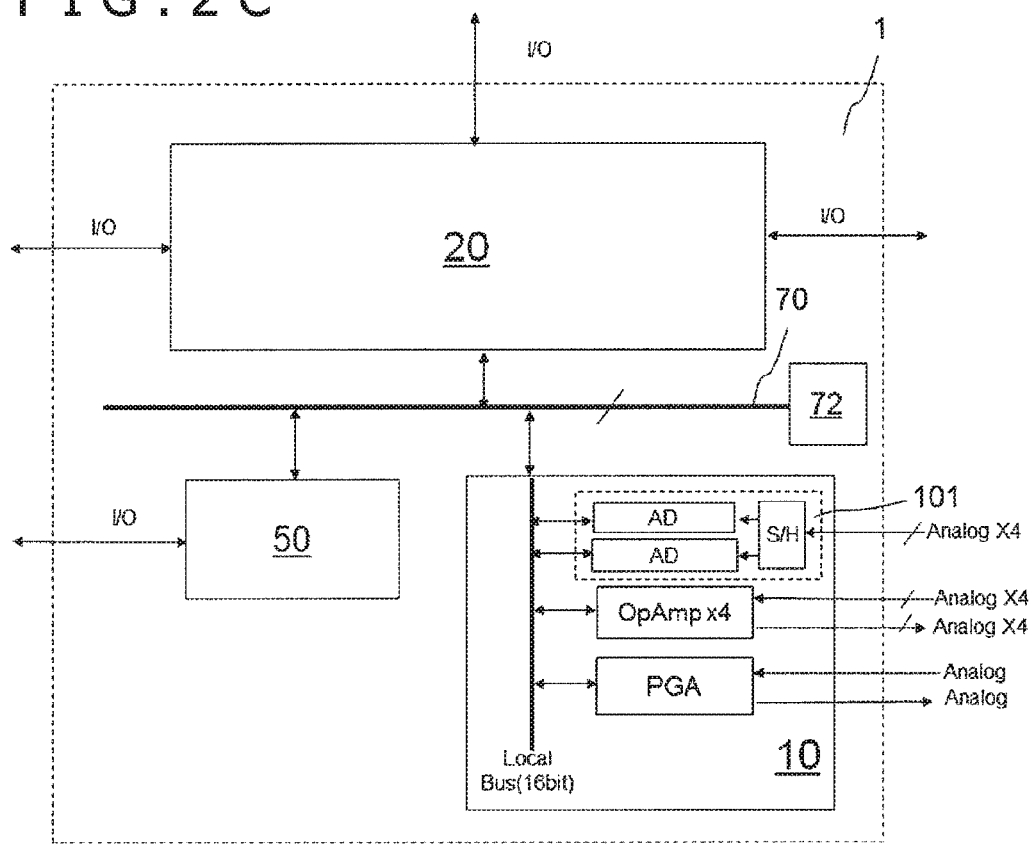
FIG. 2C is a second example of a floor plan illustrating a detailed example of an MRLD chip with an analog circuit according to the present embodiment.

FIG. 2C is a second example of a floor plan illustrating a detailed example of an MRLD chip with an analog circuit according to the present embodiment. The MRLD chip 1 illustrated in FIG. 2C includes a processor 50 in addition to the analog section 10 and the MRLD 20. The MRLD 20, the analog section 10, and the processor 50 are connected to each other via a bus 70.

When truth value data of the MRLD 20 is written via the bus 70, a bus controller 72 connects external equipment and the MRLD 20 and controls signals (data) of the respective blocks (MRLD 20, analog section 10, and processor 50) by controlling data in the bus 70.

These signals are, for example, signals between the analog section 10 and the MRLD 20, signals between the analog section 10 and the processor 50, and signals between the processor 50 and the MRLD 20. At this time, the bus controller 72 controls signal transmission to ensure that signals do not collide with each other.

Because of the bus controller 72, interconnections between the analog section 10, the MRLD 20, and the processor 50 are shared, permitting minimization of the interconnection area.

The analog section 10 has analog/digital conversion circuits AD in addition to the component elements in FIG. 2A and FIG. 2B.

Figure 2D:
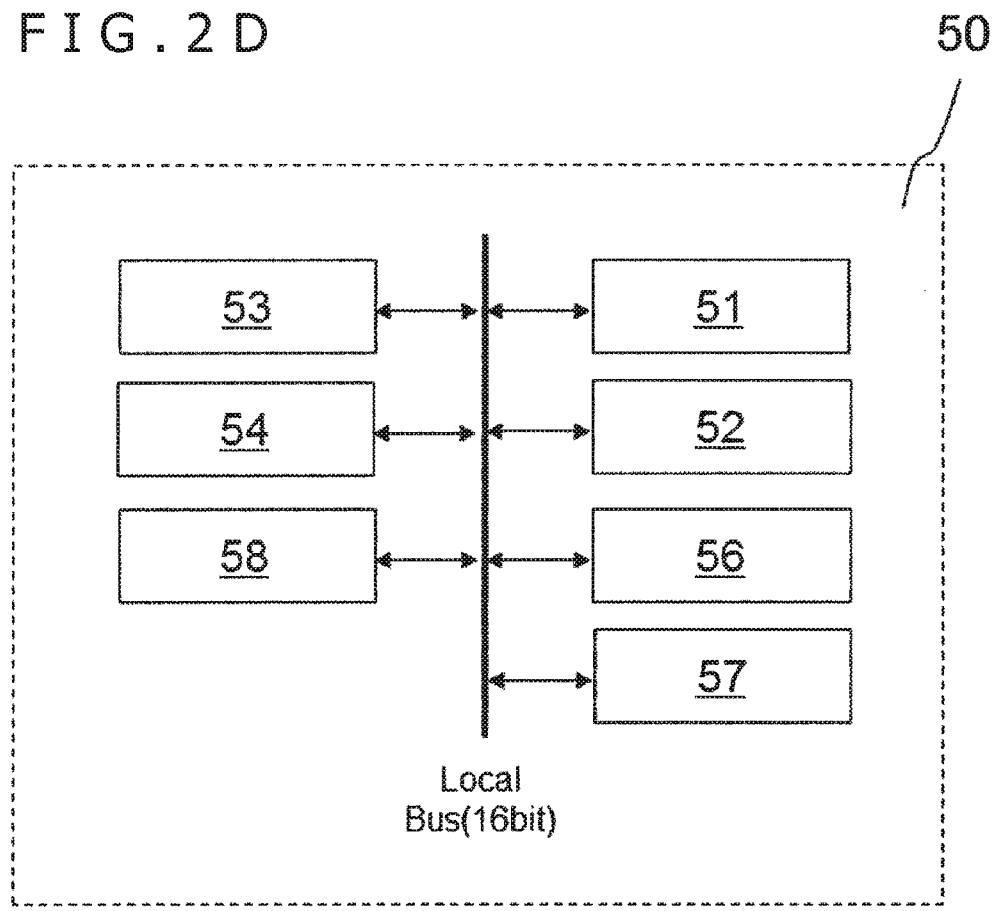
FIG. 2D is an example of a processor mounted on an MRLD chip.

FIG. 2D is an example of a processor mounted on the MRLD chip. The processor 50 has a processor core 52 that performs operations in accordance with operational instructions, a read only memory (ROM) 53, a random access memory (RAM) 54, a PWM circuit 56, a clock circuit 57, and a timer circuit 58, and these are connected via an internal bus 51.

The processor 50 is capable of reading data and programs from outside the MRLD chip 1 and also capable of reading data and programs retained in the MRLD 20. Read data is stored in the RAM 54.

The processor 50 retains truth value data (configuration data) of the MLUT 30 as the above data and outputs the data to the MRLD 20 to reconfigure the MRLD 20.

The MRLD 20 executes part of the functionality of the processor 50 as the MRLD 20 is reconfigured by truth value data sent from the processor 50.

The MRLD 20 in the MRLD chip 1 is capable of configuring the functionality of the processor 50 (e.g., processor core's operational function, RAM, PWM, clock, timer). The MRLD 20 is better at parallel processing than the processor 50. Therefore, it is possible to enhance reconfiguration capability of the MRLD chip 1 by configuring, with the MRLD 20, parallel processing functionality not available with the processor 50.

It is possible to control logic and analog functions of the MRLD 20 by managing the system of the MRLD chip 1 with the processor 50.

Figure 2E:
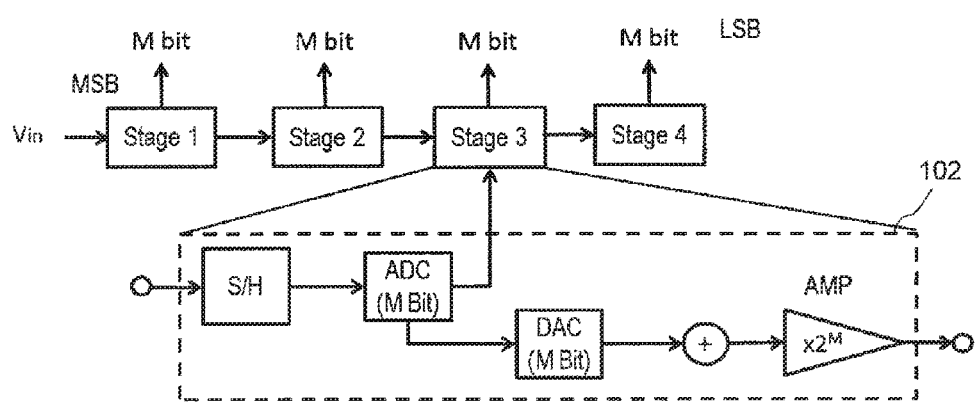
FIG. 2E is an example of an analog/digital (A/D) converter of an analog circuit.

FIG. 2E is an example of the analog/digital conversion circuit AD included in the analog section. The analog/digital conversion circuit illustrated in FIG. 2E converts an externally input analog signal into a 12-bit digital signal. The analog/digital conversion circuit includes four unit conversion circuits 102 each of which includes an analog to digital converter (ADC), a digital to analog converter (DAC), and an amplifier (AMP). After digitization by one of the unit conversion circuits 102, an analog signal input during digital conversion is converted into a digital signal by the unit conversion circuit at the subsequent stage, thus achieving 12-bit A/D conversion. Each of the unit conversion circuits processes one conversion after another to process the signal by pipelining.

It should be noted that a successive comparison type (high resolution and easy to achieve high speed), a delta sigma type (slow conversion speed although highest in resolution), a flash type (fastest, but difficult to achieve high resolution and large circuit configuration), or other type of A/D conversion circuit may be used rather than the A/D conversion circuit illustrated in FIG. 2E.

2. MRLD

Figure 3:
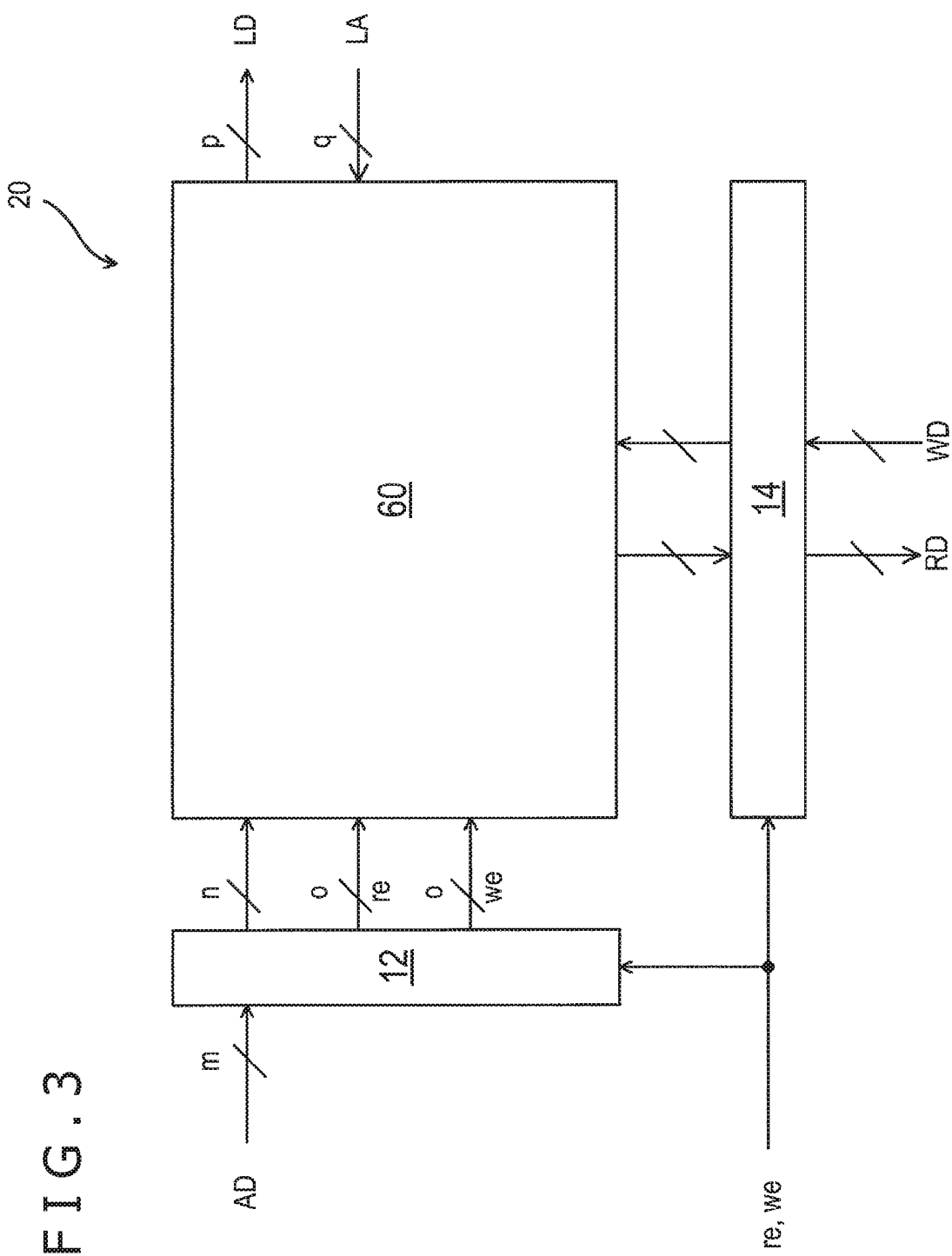
FIG. 3 is a diagram illustrating a first example of an overall configuration of a semiconductor device according to the present embodiment.

FIG. 3 is a diagram illustrating an example of an overall configuration of a semiconductor device according to the present embodiment. "20" indicated in FIG. 3 represents an example of an MRLD. The MRLD 20 has an MLUT array 60, a row decoder 12, and a column decoder 14. The MLUT array 60 contains a plurality of MLUTs 30 using synchronous SRAMs. The row decoder 12 and the column decoder 14 identify memory write and read operations of the MLUTs 30.

The MLUT 30 includes a synchronous SRAM. As pieces of data considered as truth tables are each stored in memory storage elements, the MLUT 30 performs logic operation as a logic element, a connection element, or a logic element and a connection element.

In the logic operation of the MRLD 20, signals of a logic address LA and a logic data LD depicted by solid lines are used. The logic address LA is used as an input signal to a logic circuit. Then, the logic data LD is used as an output signal from a logic circuit. The logic address LA of the MLUT 30 is connected to a data line of the logic data LD of the adjacent MLUT.

The logic realized by the logic operation of the MRLD 20 is realized by truth table data stored in the MLUT 30. Some of the MLUTs 30 operate as logic elements as a combinational circuit having an AND circuit, an adder, and other circuits. Other MLUTs 30 operate as connection elements connecting the MLUTs 30 that realize combinational circuits. Rewriting of truth table data for the MLUTs 30 to realize logic elements and connection elements is achieved by memory write operation.

Write operation of the MRLD 20 is conducted by a write address AD and write data WD, and read operation is conducted by the write address AD and read data RD.

The write address AD is an address that identifies memory cells in the MLUT 30. The write address AD identifies n memory cells by m signal lines, with n being equal to $2^m$. The row decoder 12 receives an MLUT address via the m signal lines and also decodes the MLUT address, and selects and identifies the MLUT 30 subject to memory operation. A memory operation address is used for memory read operation, memory write operation, and for both operations, and is decoded by the row decoder 12 and the column decoder 14 via the m signal lines to select the target memory cells. It should be noted that although described later, decoding of the logic operation address LA is performed by the decoder in the MLUT.

The row decoder 12 decodes x bits of the m bits of the write address AD in accordance with control signals such as a read-enable signal re and a write-enable signal we and outputs a decoded address n to the MLUT 30. The decoded address n is used as an address that identifies memory cells in the MLUT 30.

The column decoder 14 decodes y bits of the m bits of the write address AD and, having functionality similar to the row decoder 12, outputs the decoded address n to the MLUT 30, and inputs the write data WD, and outputs the read data RD.

If the MLUT's array has s rows by t columns, n-by-t-bit data is input to the decoder 12 from the MLUT array 60. In order to select an MLUT for each row, the row decoder outputs as many "re"s and "we"s as the number of o rows. That is, o rows correspond to s rows of the MLUT. Here, a word line of a particular memory cell is selected by asserting only one of the o bits. Then, because t MLUTs output n-bit data, n-by-t-bit data is selected from the MLUT array 60. The column decoder 14 is used to select one column thereof.

3. MLUT

Figure 4:
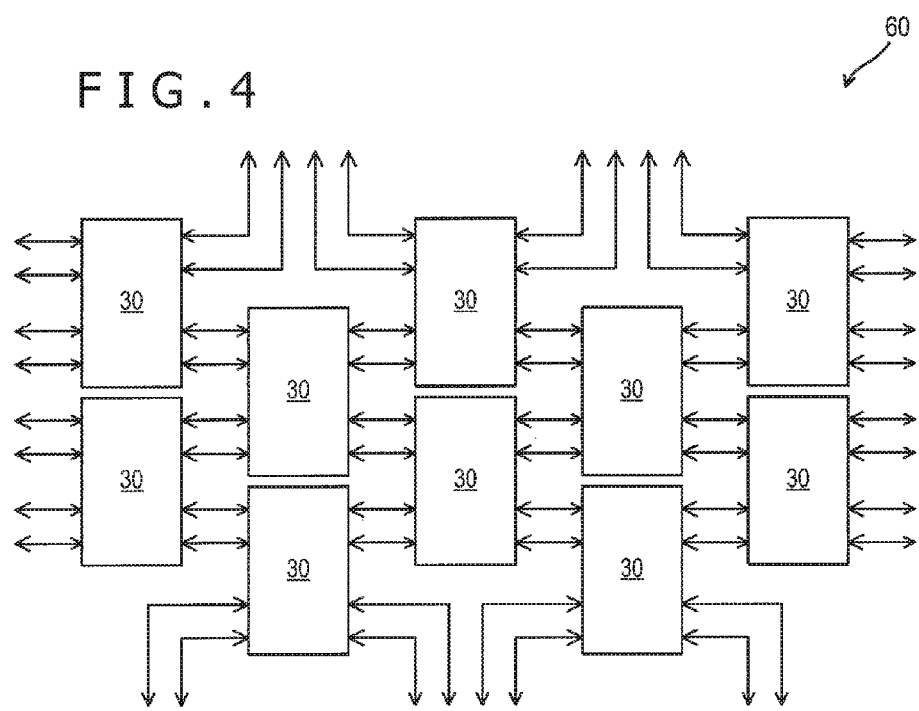
FIG. 4 is a diagram schematically illustrating a multi look up table (MLUT) configured by horizontally stacking MLUTs that include two memory cell units.

FIG. 4 is a diagram schematically illustrating an MLUT configured by horizontally stacking MLUTs that include two memory cell units. The MLUTs 30 illustrated in FIG. 4 have address inputs A0L to A7L from left indicated in FIG. 5, address inputs A0R to A7R from right indicated in FIG. 5, data outputs D0L to D7L to left indicated in FIG. 5, and data outputs D0R to D7R to right indicated in FIG. 5. An MLUT with an n value=8 is conventionally 1 Mbit, and a configurable logic block (CLB) equivalent is 4 Mbits or large-scale data. In contrast, in the present proposal, the MLUT includes 8 kbits (256 words by 16 bits by 2 MLUTs) as will be described later.

Figure 6:
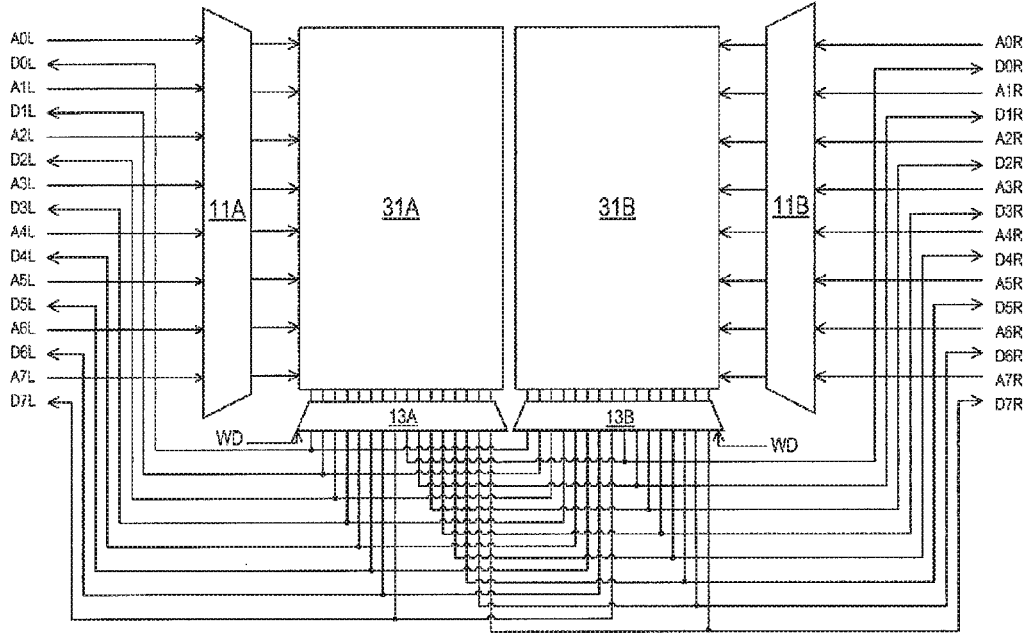
FIG. 6 is a diagram illustrating a circuit example of the MLUT illustrated in FIG. 5.

FIG. 6 is a diagram illustrating an example of an MLUT using large-capacity memories.

Figure 5:
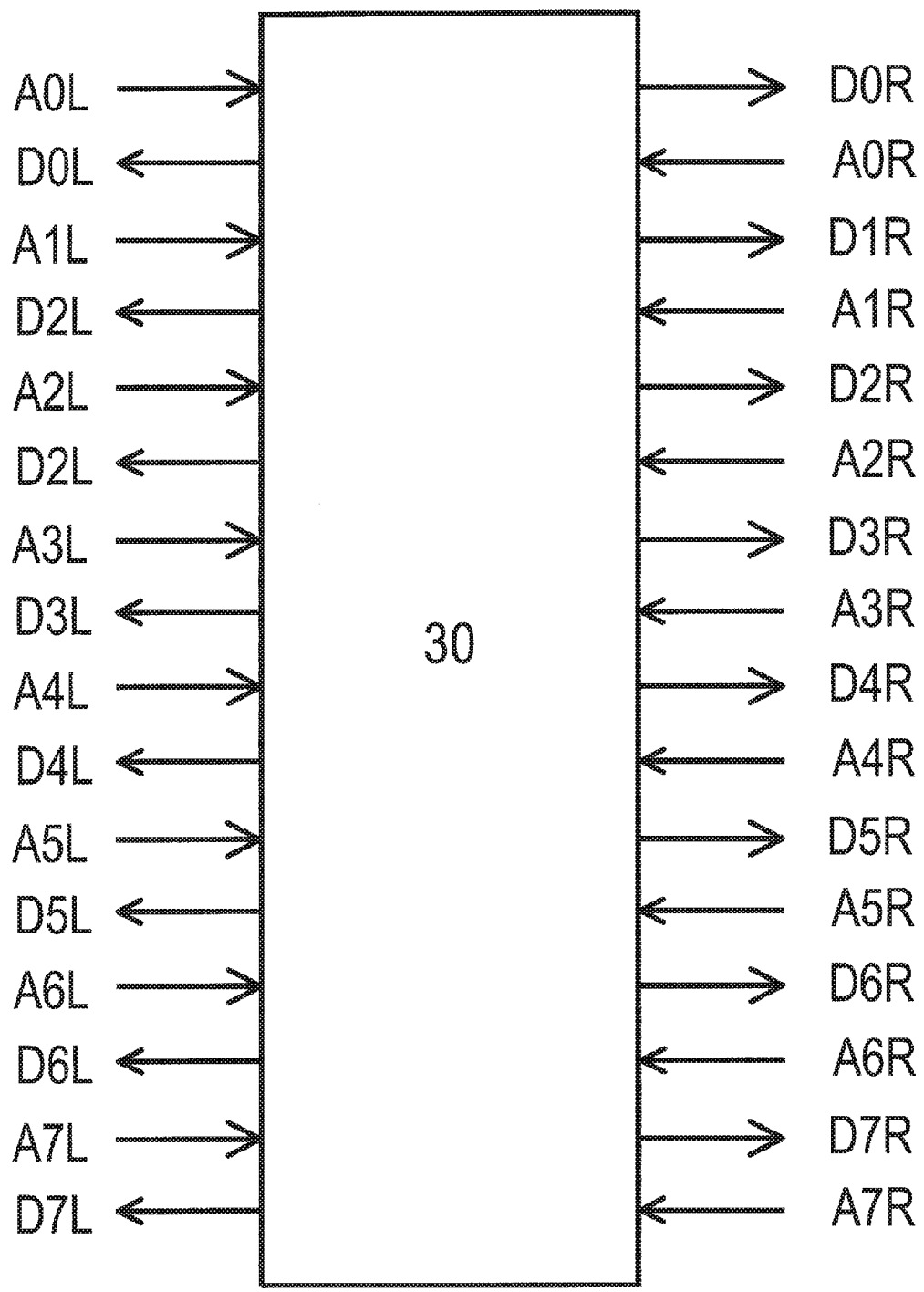
FIG. 5 is a diagram illustrating an example of an MLUT using a large capacity memory.

FIG. 6 is a diagram illustrating a circuit example of the MLUT illustrated in FIG. 5. The MLUT 30 illustrated in FIG. 6 has a memory cell unit 31A and a memory cell unit 31B. The memory cell units are, for example, SRAMs. As illustrated in FIG. 6, the memory cell unit 31A has a plurality of memory cells that are identified by first multiple address lines from one side and that produce output to first multiple data lines whose number is twice that of the first multiple address lines. The memory cell unit 31B has a plurality of memory cells that are identified by second multiple address lines from other side and that produce output to second multiple data lines whose number is twice that of the second multiple address lines. The MLUT 30 outputs part of the first multiple data lines and the second multiple data lines to the one side and outputs other part of the first multiple data lines and the second multiple data lines to the other side.

Each memory cell unit stores truth table data in the memory cells for each direction. For this reason, each of the memory cell units 31A and 31B stores truth table data from right to left direction and truth table data from left to right direction. That is, the MLUT stores two pieces of truth table data each of which defines a particular data output direction.

By increasing the number of data of each memory cell unit more than the number of addresses and outputting data bidirectionally from each memory cell unit, it is possible to keep the necessary number of memory cells low and permit bidirectional data output.

Figure 7:
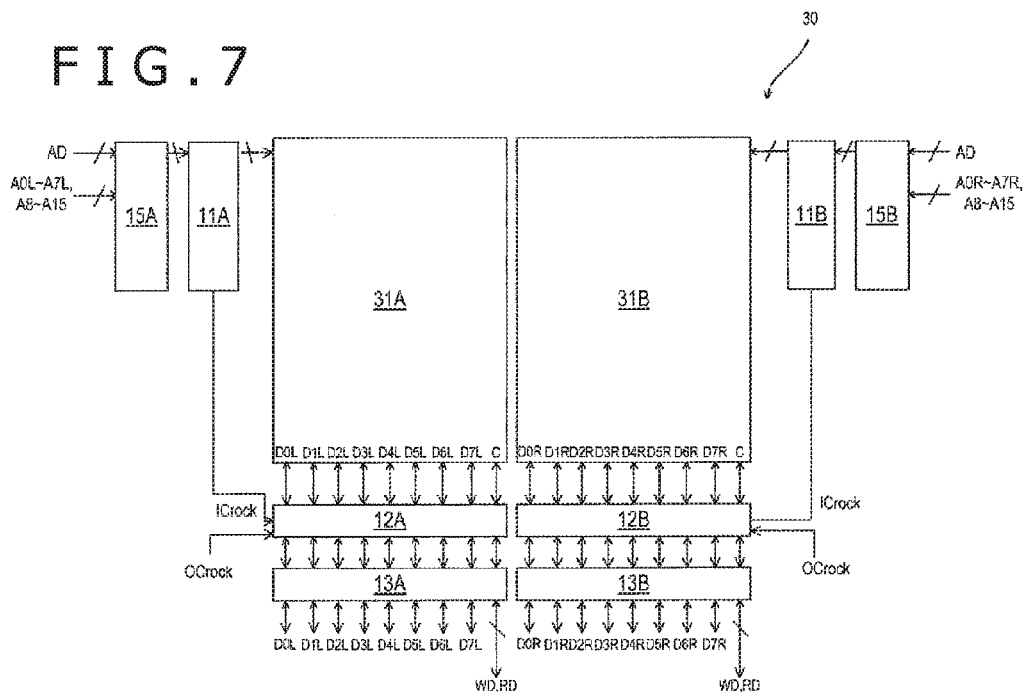
FIG. 7 is a diagram describing an MRLD using the MLUT illustrated in FIG. 5.

FIG. 7 illustrates a more detailed circuit example than the MLUT depicted in FIG. 6. The MLUT 30 illustrated in FIG. 7 has the memory cell unit 31A, the memory cell unit 31B, an address decoder 11A, an address decoder 11B, an address selector 15A, an address selector 15B, an input/output (I/O) buffer 12A, an I/O buffer 12B, a data selector 13A, and a data selector 13B. Each of the memory cell units 31A and 31B has an address decoder, an address selector, an I/O buffer, and a data selector. Input addresses to the memory cell unit 31A and the memory cell unit 31B are addresses A0L to A7L and A8 and A15 and addresses A0R to A7R and A8 to A15, respectively. Therefore, the memory cell unit 31A and the memory cell unit 31B offer a large capacity of $2^{16}$ (65,536) words by 8 bits or 512K.

In FIG. 7, the memory cell unit 31A and the memory cell unit 31B have inputs of the addresses A0L to A7L and A8 to A15 and the addresses A0R to A7R and A8 to A15, respectively.

It should be noted that FIG. 6 is a schematic diagram that does not illustrate decoders and other peripheral circuits of the memory cell units. As for decoders, the decoder 11A and the decoder 11B described in FIG. 7 are available for each memory cell unit and provided between the address selector 15A and the address selector 15B and the memory cell unit 31A and the memory cell unit 31B, respectively. Therefore, the decoders may decode all the addresses output from the address selector 15A and the address selector 15B.

The address selector 15A and the address selector 15B are selection circuits for switching between address lines for logic operation and address for write addresses. Address selector is required for a single-port memory cell. Address selector is not required for a dual-port memory cell. The data selector 13A and the data selector 13B are selection circuits to switch between output data and the write data WD.

A conventional large-capacity memory device may be used as an MRLD rather than going through a semiconductor design prototyping and manufacture for a dedicated compact SRAM. When an MRLD is configured with chips, memory intellectual property (IP) is used. With extremely small memory capacity required by conventional MLUT, the address decoder and sense amplifier area is large, resulting in 50% or less composition of the memory itself. This translates into MRLD overhead, leading to poor efficiency. In the case of a large-capacity memory, the composition of the address decoder and sense amplifier decreases, and memory utilization efficiency increases. Therefore, the present proposal fit for a large-capacity memory is effective for MRLD chip.

4. Synchronous/Asynchronous MLUT

The MLUT according to the present embodiment includes memory cell units for synchronous operation and memory cell units for asynchronous operation. Memory cell units for synchronous operation or memory cell units for asynchronous operation form a pair. However, only one of the memory cell units operates as a logic element and/or a connection element. Data outputs of the two memory cell units are connected in wired-OR fashion or connected by an OR circuit. Therefore, data "0" is stored for all in the inactive memory cell unit.

FIG. 8 is a diagram illustrating a circuit example of a synchronous/asynchronous switchable MLUT. The MLUT 30 illustrated in FIG. 8 has the memory cell unit 31A to a memory cell unit 31D, the address decoder 11A to an address decoder 11D, the I/O buffer 13A to an I/O buffer 13D, a selection circuit 32A to a selection circuit 32D, a data selection circuit 33, and an address transition detection section 35. The address transition detection section 35 includes an address transition detector (ATD) and compares a logic address sent along with a clock against a previously sent logic address to detect an address transition. The address transition detection section 35 is the same as that depicted in FIG. 9.

4.1 Address Transition Detection Section

Figure 9:
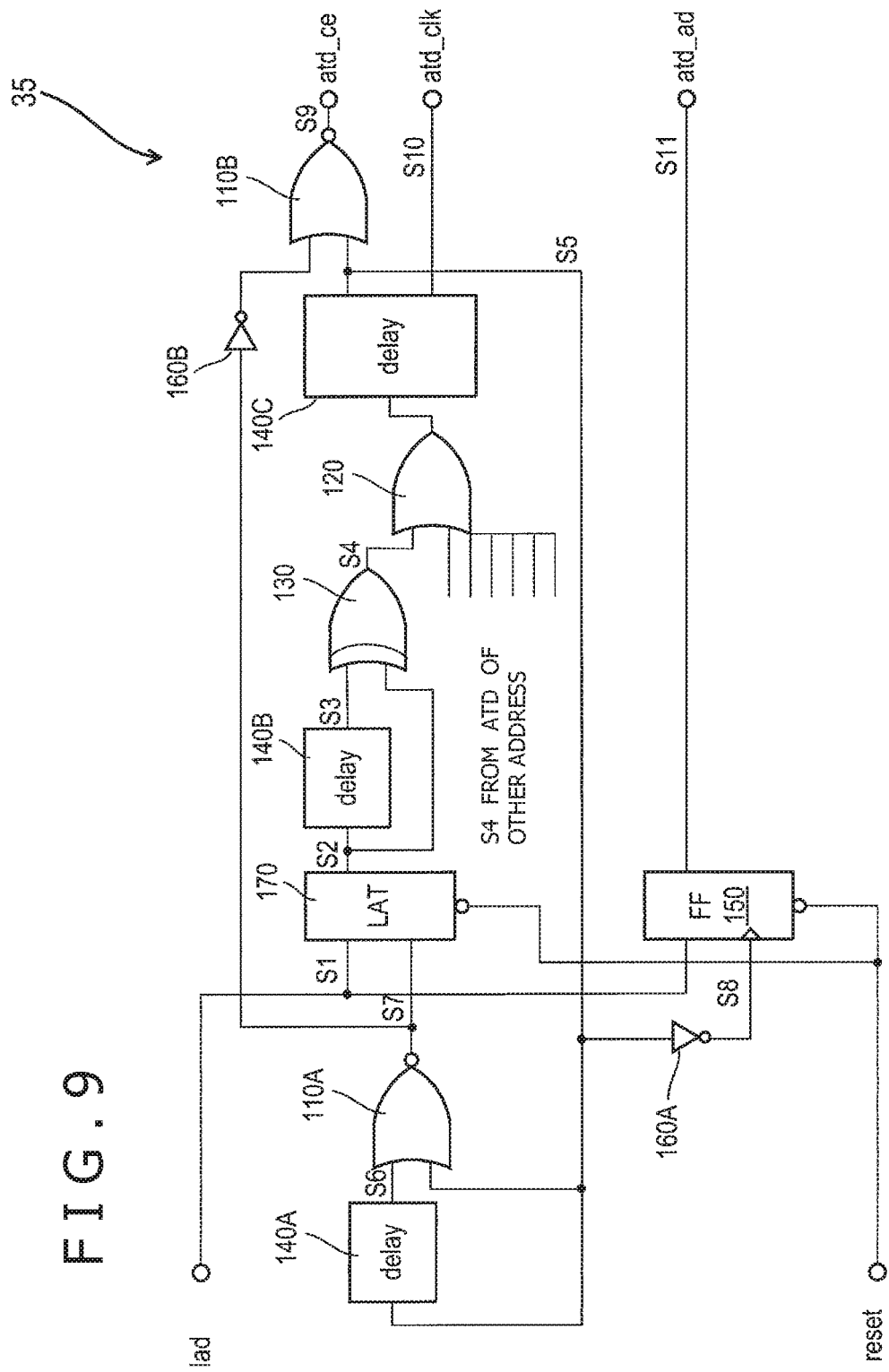
FIG. 9 is a circuit diagram of an address transition detection section according to the present embodiment.

FIG. 9 is a circuit diagram of the address transition detection section according to the present embodiment. The address transition detection section 35 illustrated in FIG. 9 has a negative logical sum (NOR) circuit 110A, a negative logical sum (NOR) circuit 110B, a logical sum (OR) circuit 120, an exclusive logical sum (EOR) circuit 130, a delay circuit 140A to a delay circuit 140C, a flip-flop (FF) 150, an inverter 160B, and a D latch 170.

Figure 10:
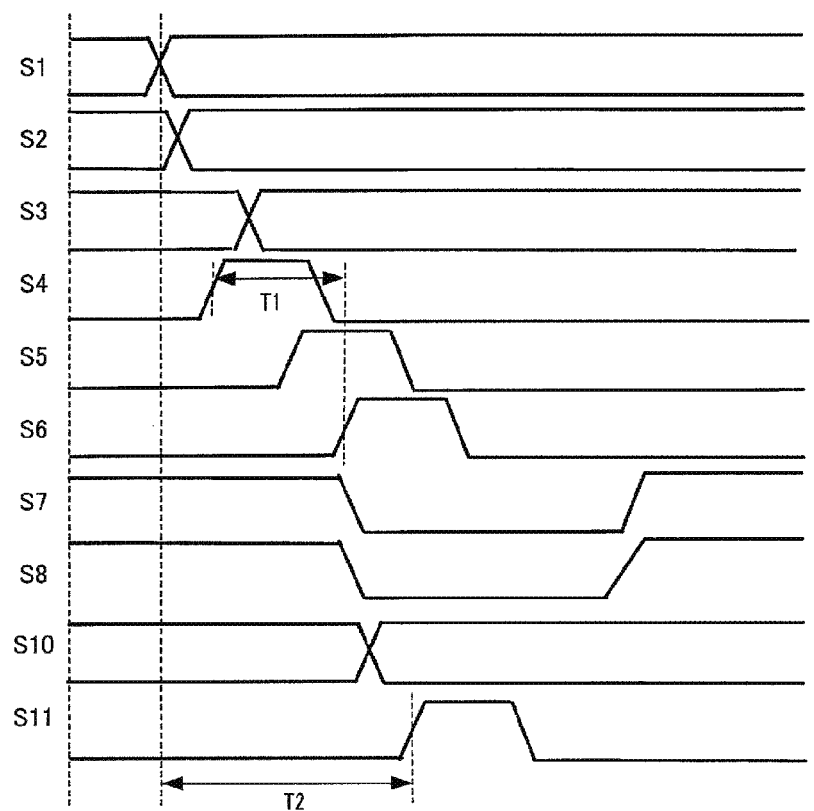
FIG. 10 is a timing diagram of signals for the address transition detection illustrated in FIG. 9.

FIG. 10 is a timing diagram of signals for the address transition detection illustrated in FIG. 9. Circuit operation for address transition detection will be described below by describing FIG. 9 and FIG. 10.

A signal S1 is an address input signal output from the processor. A signal S2 is a D latch output. The D latch 170 latches the signal S1 to keep the signal S1 constant for a given length of time in the event of a change in the signal S1. This is intended to ignore subsequent address transitions caused, for example, by noise.

A signal S3 is a delayed signal output from the D latch 170. The delayed signal is delayed by the delay circuit 140B to produce a clock by its leading edge and trailing edge and generate a clock width of a signal S4 as depicted in FIG. 10.

The signal S4 generated as a clock signal is output from the EOR 130 when a change is detected. The input and output of the delay circuit 140B are input to the EOR 130. Therefore, if the levels of the two signals differ, the EOR 130 outputs a "high" signal level. This allows an address transition to be detected. Time T1 of S4 indicated in FIG. 10 represents the duration from the detection of a change in logic address to the loading of the change into the FF, and time T2 represents the duration from the detection of a change in logic address to the reading of the memory cell unit.

Other address transition signals are input to the OR circuit 120 together with the signal S4. The OR circuit 120 outputs an ORed value. The output of the OR circuit 120 is delayed by the delay circuit 140C, and a signal S5 is output.

The signal S5 is a delayed signal output from the delay circuit 140C and waits for an enable signal to the D latch 170 to input a clock.

A signal S6 is a signal extension of the signal S5 and generates an enable signal pulse. The NOR circuit 110A outputs a signal S7 that is the NORed value of the signal S5 and the signal S6. Then, the signal S7 serves as an enable signal to the D latch 170. A signal S8 is a signal obtained by inverting the signal S5 by an inverter 160A. The signal S8 is used in the FF 150 as a clock to latch an address signal. A signal S9 is used as an enable to the memory cell unit 31A and the memory cell unit 31C provided at the subsequent stage. A signal S10 is used as a clock (atd_clk) to the memory cell unit 31A and the memory cell unit 31C. A signal S11 is used as an address to the memory cell unit 31A and the memory cell unit 31C. The signal S10 in FIG. 10 indicates the duration from the detection of a change in logic address to the reading from the memory.

Thus, if a request is made for data of a processor core 210, a change in address thereof is waited for to generate a clock and drive the memory. As a result, the memory is activated when necessary but is left inactive when not necessary, autonomously keeping power consumption low.

4.2 Signal Lines

Signal lines illustrated in FIG. 8 will be described with Table 2 depicted below.

TABLE 2

| | sram_ck | | |
|---|---|---|---|
| mlctrl | sram_ck(async) | mlctrl | sram_ck(sync) |
| 0 | atd_clk | — | clk |
| 1 | clk | | |

| | | sram_ce | | | |
|---|---|---|---|---|---|
| reset | mlctrl | sram_ce(async) | reset | mlctrl | sram_ce(sync) |
| 1 | 0 | atd_ce | 1 | 0 | 0 |
| 1 | 1 | ce | 1 | 1 | ce |
| 0 | 1 | 0 | 0 | 1 | 0 |
| Other than above | | 1 | Other than above | | 1 |

TABLE 2-continued

| | | sram_address | | | |
|---|---|---|---|---|---|
| reset | mlctrl | sram_ce(async) | reset | mlctrl | sram_ce(sync) |
| 1 | 0 | atd_address | 1 | 0 | 0 |
| 1 | 1 | mad | 1 | 1 | ce |
| Other than above | | 0 | Other than above | | 0 |

*mlctrl = 0/1: Logic mode/Config mode 4.3 Synchronous/Asynchronous Memory Cell Units The memory cell unit 31A to memory cell unit 31D are synchronous SRAMs. Each of the memory cell units 31A to 31D stores truth table data to connect for leftward direction and rightward direction. The memory cell unit 31B and the memory cell unit 31D operate in synchronism with a system clock. On the other hand, the memory cell unit 31A and the memory cell unit 31C operate in synchronism with an ATD-generated clock (also referred to as "internal clock signal"), to be described later, generated by the address transition circuit 35 and, therefore, operate out of synchronism with the clock (system clock). The ATD-generated clock runs at a higher frequency than the system clock signal. As a result, it looks as though the memory cell unit 31A and the memory cell unit 31C operate asynchronously as seen from outside the MLUT 30, providing asynchronous functionality.

Except for the synchronous functionality requirements, the memory cell unit 31A and the memory cell unit 31C have the same functionality as that of the memory cell unit 31A and the memory cell unit 31B illustrated in FIG. 6 and FIG. 7. The same is true for the memory cell unit 31B and the memory cell unit 31D.

Both the address decoder 11A and the address decoder 11B decode addresses A0 to A3 input from left, output decoded signals to the memory cell unit 31A and the memory cell unit 31B, and assert word lines of the memory cell unit 31A and the memory cell unit 31B, respectively.

The address decoder 11C and the address decoder 11D decode addresses A4 to A7 input from right, output decoded signals to the memory cell unit 31C and the memory cell unit 31D, and assert word lines of the memory cell unit 31C and the memory cell unit 31D, respectively.

Also, the address decoder 11A and the address decoder 11C decode an SRAM address asynchronous signal (sram_address(async)) and an SRAM address synchronous signal (sram_address(sync)) and assert the word lines of the memory cell unit identified by decoded signals.

In the example illustrated in FIG. 8, each memory cell unit is a 16-word×8-bit memory block. For the memory cell unit 31A and the memory cell unit 31B, 16-word×8-bit×2 can be used in synchronous mode, and 16-word×8-bit×2 can be used in asynchronous mode. Simultaneous operation in synchronous and asynchronous modes is not possible. For example, if logic data is written to one memory cell unit operating in synchronous mode, it is necessary to write 0s for all to the memory unit operating in asynchronous mode.

It should be noted that data outputs from the memory cell units may be connected in wired-OR fashion as illustrated. Alternatively, an OR logic circuit may be provided.

4.4 Selection Circuits

The selection circuit 32A to selection circuit 32D select operation of the memory cell unit 31A and the memory cell unit 31C for asynchronous operation or operation of the memory cell unit 31B and the memory cell unit 31C for synchronous operation.

When asynchronous operation is selected by a selection signal (Select), the selection circuit 32A selects an atd_ad latch address (S11 in FIG. 9) generated by the address transition circuit 35 and outputs this address as the SRAM address asynchronous signal (sram_address(async)). If asynchronous operation is not selected, the logic address is output as is.

When asynchronous operation is selected by the selection signal (Select), the selection circuit 32B selects and outputs the ATD-generated clock generated by the address transition circuit 35. If asynchronous operation is not selected, the clock is output as is.

When asynchronous operation is selected by the selection signal (Select), the selection circuit 32C selects and outputs an ATD-generated chip select generated by the address transition circuit 35. If asynchronous operation is not selected, an SRAM chip enable is output as is.

When synchronous operation is selected by the selection signal (Select), the selection circuit 32D outputs the logic address as is.

4.2 Inhibit Logic

Also, inhibit logic configuration is one of characteristics of memory division. The necessity of inhibit logic will be described using two truth tables depicted in Table 3.

TABLE 3

| Truth Table 1 | | | |
|---|---|---|---|
| Case | A0 | A1 | D0 |
| a | 0 | 0 | 0 |
| b | 0 | 1 | 0 |
| c | 1 | 0 | 0 |
| d | 1 | 1 | 1 |

| Truth Table 2 | | | |
|---|---|---|---|
| Case | A0 | A4 | D0 |
| a | 0 | 0 | 0 |
| b | 0 | 1 | 0 |
| c | 1 | 0 | 0 |
| d | 1 | 1 | 1 |

Truth table 1 depicts a truth table for an AND circuit formed using A0 and A1 with an output D0. Truth table 2 depicts a truth table for an AND circuit formed using A0 and A4 with an output D0. In the case of logic of truth table 1, logic operations can be performed only with the memory cell unit 31A that uses A3 to A0. As long as 0s are written to the other memory cell unit, the output value of the other memory cell unit has no impact because of ORing operation. As a result, no inhibit logic problem occurs.

In the case of logic of truth table 2, on the other hand, the memory cell unit that uses A3 to A0 cannot distinguish between c and d. The SRAM that uses A7 to A4 cannot distinguish between b and d. Thus, when logic operation spreads over two memory cell units, a correct value cannot be obtained from two truth tables. Therefore, logic operation that spreads over two memory cell units is considered as inhibit logic. As a result, when logic is configured, it is necessary to realize the logic in each memory cell unit. For this reason, truth table data according to the present embodiment is generated such that the above inhibit logic does not take place.

4.5 I/O Buffers

The I/O buffer 13A to I/O buffer 13D provide FF functionality by reading data from the data lines of the memory cell units in synchronism with the clock or the ATD-generated clock. It should be noted that the I/O buffer 13A to I/O buffer 13D include sense amplifiers that amplify voltages output from bit lines of the memory cells.

The selection circuit 33 outputs SRAM data output (0_data) as SRAM data output or logic data output in accordance with a selection signal.

5. MLUT Logic Operation

A. Logic Elements

Figure 11:
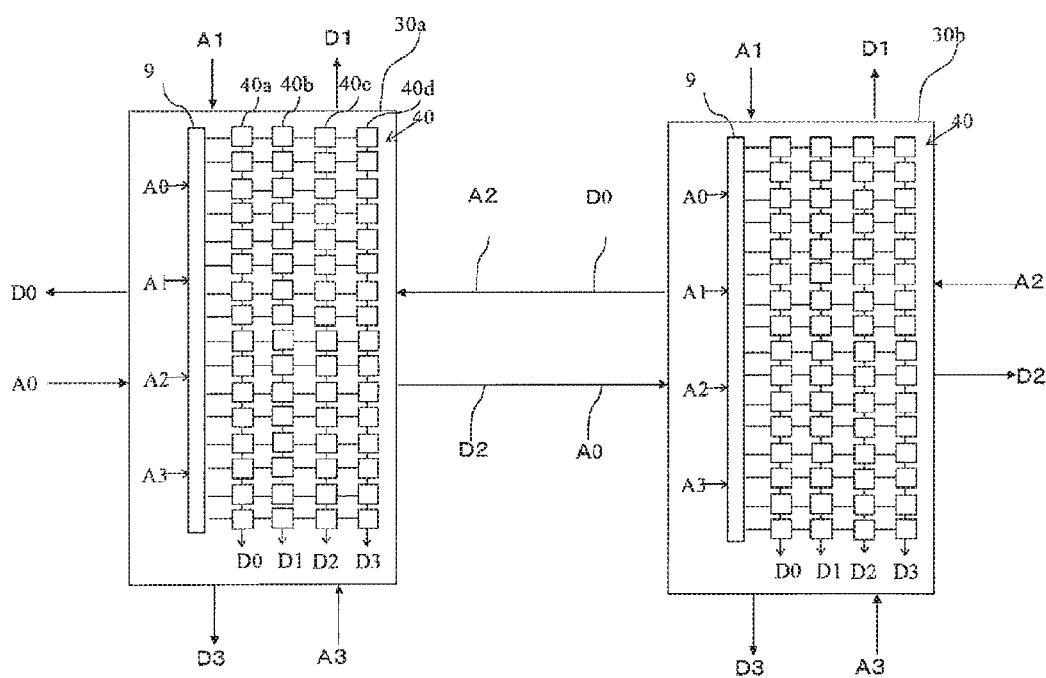
FIG. 11 is a diagram illustrating an example of an MLUT.

FIG. 11 is a diagram illustrating an example of an MLUT. The address selectors 11, the input/output buffers 12, and the data selectors 13 are omitted for easy description. Each of MULTs 30A and 30B illustrated in FIG. 11 has four logic address input LA line A0 to logic address input LA line A3, four logic operation data line D0 to logic operation data line D3, 4×16=64 storage elements 40, and an address decoder 9. Each of the logic operation data lines D0 to D3 connects the 16 storage elements in series. The address decoder 9 is configured to select the four storage elements connected to one of the 16 word lines based on signals input to the logic address input LA line A0 to logic address input LA line A3. The four storage elements are connected to the logic operation data line D0 to logic operation data line D3, respectively, to output data stored in the storage elements to the logic operation data line D0 to logic operation data line D3. For example, the address decoder 9 can be configured to select four storage elements or storage elements 40A to storage element 40D if appropriate signals are input to the logic address input LA line A0 to logic address input LA line A3. Here, the storage element 40A is connected to the logic operation data line D0, and the storage element 40B is connected to the logic operation data line D1, and the storage element 40D is connected to the logic operation data line D2, and the storage element 40D is connected to the logic operation data line D3. Then, signals stored in the storage element 40A to storage element 40D are output to the logic operation data line D0 to logic operation data line D3. Thus, the MULT 30A and the MULT 30B receive a logic address input LA from the logic address input LA line A0 to logic address input LA line A3 and outputs values stored in the four storage elements 40 selected by the address decoder 9 based on the logic address input LA to the logic operation data line D0 to logic operation data line D3, respectively, as logic operation data. It should be noted that the logic address input LA line A2 of the MULT 30A is connected to the logic operation data line D0 of the adjacent MULT 30B, and the MULT 30A receives logic operation data output from the MULT 30B as the logic address input LA. Also, the logic operation data line D2 of the MULT 30A is connected to the logic address input LA line A0 of the MULT 30B, and the MULT 30B receives logic operation data output from the MULT 30A as the logic address input LA. For example, the logic operation data line D2 of the MULT 30A outputs the signal stored in one of the 16 storage elements connected to the logic operation data line D2 to the logic address input LA line A0 of the MULT 30B based on the signals input to the logic address input LA line A0 to logic address input LA line A3 of the MULT 30A. Similarly, the logic operation data line D0 of the MULT 30B outputs the signal stored in one of the 16 storage elements connected to the logic operation data line D0 to the logic address input LA line A2 of the MULT 30A based on the signals input to the logic address input LA line A0 to logic address input LA line A3 of the MULT 30B. Thus, MLUTs are connected by using a pair of address line and data line. Hereinafter, a pair of address line and data line such as the logic address input LA line A2 and the logic operation data line D2 of the MULT 30A used to connect MLUTs will be referred to as an "AD pair."

It should be noted that although the MULT 30A and the MULT 30B have four AD pairs in FIG. 11, the number of AD pairs is not particularly limited to four as will be described later.

FIG. 12 is a diagram illustrating an example of an MLUT that operates as a logic circuit. In the present example, a logic circuit is configured to input the logic address input LA line A0 and the logic address input LA line A1 to a two-input NOR circuit 701, to input the logic address input LA line A2 and the logic address input LA line A3 to a two-input NOR circuit 702, to then input the output of the two-input NOR circuit 701 and the output of the two-input NOR circuit 702 to a two-input NAND circuit 703, and to output the output of the two-input NAND circuit 703 to the logic operation data line D0.

FIG. 13 is a diagram illustrating a truth table of the logic circuit illustrated in FIG. 12. The logic circuit in FIG. 12 has four inputs. Therefore, all the inputs or the input A0 to input A3 are used as inputs. On the other hand, the logic circuit has only one output. Therefore, only the output D0 is used as an output. "*" is indicated in columns of the output D1 to output D3 of the truth table. This means that both the values "0" and "1" are acceptable. However, when truth table data is actually written to an MLUT for reconfiguration, it is necessary to write the value "0" or "1" in these columns.

B. Connection Elements

FIG. 14 is a diagram illustrating an example of an MLUT that operates as a connection element. In FIG. 14, the MLUT as a connection element operates such that the signal of the logic address input LA line A0 is output to the logic operation data line D1, such that the signal of the logic address input LA line A1 is output to the logic operation data line D2, and such that the signal of the logic address input LA line A2 is output to the logic operation data line D3. Further, the MLUT as a connection element operates such that the signal of the logic address input LA line A3 is output to the logic operation data line D0.

FIG. 15 is a diagram illustrating a truth table of the connection element illustrated in FIG. 14. The connection element illustrated in FIG. 14 has four inputs and four outputs. Therefore, all the inputs or the input A0 to input A3 and all the outputs or the output D0 to output D3 are used. The MLUT operates as a connection element that outputs the signal of the input A0 to the output D1, outputs the signal of the input A1 to the output D2, outputs the signal of the input A2 to the output D3, and outputs the signal of the input A3 to the output D0 in accordance with the truth table illustrated in FIG. 15.

FIG. 16 is a diagram illustrating an example of a connection element realized by an MLUT having four AD pairs or an AD pair 0, an AD pair 1, an AD pair 2, and an AD pair 3. The AD 0 has the logic address input LA line A0 and the logic operation data line D0. The AD 1 has the logic address input LA line A1 and the logic operation data line D1. The AD 2 has the logic address input LA line A2 and the logic operation data line D2. Then, the AD 3 has the logic address input LA line A3 and the logic operation data line D3. In FIG. 16, the long dashed double-short dashed line represents the flow of a signal that has been input to the logic address input LA line A0 of the AD pair 0 is output to the logic operation data line D1 of the AD pair 1. The broken line represents the flow of a signal that has been input to the logic address input LA line A1 of the AD pair 1 is output to the logic operation data line D2 of the AD pair 2. The solid line represents the flow of a signal that has been input to the logic address input LA line A2 of the AD pair 2 is output to the logic operation data line D3 of the AD pair 3. The long dashed short dashed line represents the flow of a signal that has been input to the logic address input LA line A3 of the AD pair 3 is output to the logic operation data line D0 of the AD pair 0.

It should be noted that although the MLUT 30 has four AD pairs in FIG. 16, the number of AD pairs is not particularly limited to four.

C. Combination Function Between Logic Element and Connection Element

FIG. 17 is a diagram illustrating an example of a single MLUT that operates as a logic element and as a connection element. In the example illustrated in FIG. 17, a logic circuit is configured that inputs the logic address input LA line A0 and the logic address input LA line A1 to a two-input NOR circuit 121, that inputs the output of the two-input NOR circuit 121 and the logic address input LA line A2 to a two-input NAND circuit 122, and that outputs the output of the two-input NAND circuit 122 to the logic operation data line D0. Also, at the same time, a connection element is configured that outputs signals of the logic address input LA line A3 to the logic operation data line D2.

FIG. 18 illustrates a truth table of the logic element and the connection element illustrated in FIG. 17. The logic operation in FIG. 17 uses three inputs of the inputs D0 to D3 and one output or the output D0. In FIG. 18, on the other hand, a connection element is configured that outputs the signal of the input A3 to the output D2.

FIG. 19 is a diagram illustrating an example of a logic operation and a connection element realized by an MLUT having four AD pairs or the AD 0, the AD 1, the AD 2, and the AD 3. As with the MLUT illustrated in FIG. 16, the AD 0 has the logic address input LA line A0 and the logic operation data line D0. The AD 1 has the logic address input LA line A1 and the logic operation data line D1. The AD 2 has the logic address input LA line A2 and the logic operation data line D2. Then, the AD 3 has the logic address input LA line A3 and the logic operation data line D3. As described above, the MLUT 30 realizes, with the single MLUT 30, two operations, namely, logic operation with three inputs and one output and a connection element with one input and one output.

Specifically, for logic operation, the logic address input LA line A0 of the AD pair 0, the logic address input LA line A1 of the AD pair 1, and the logic address input LA line A2 of the AD pair 2 are used as inputs. Then, the address line of the logic operation data line D0 of the AD pair 0 is used as an output. Also, the connection element outputs the signal input to the logic address input LA line A3 of the AD pair 3 to the logic operation data line D2 of the AD pair 2.

FIG. 20 is a conceptual diagram illustrating an example of connection between an external system and an MRLD. An external system 120 is an information processing device or a device realized by SoC. The external system 120 is connected to the MRLD 20 illustrated in FIG. 5, receives data output from the MRLD 20, performs logic operation to decide whether to change pages, and outputs, through the connection, a page change signal to the addresses A8 to A15. Because of the SoC incorporated in the external system, a highly functional system can be realized together with the MRLD 20.

6. Truth Table Data Generation Method

Truth table data applied to the reconfigurable semiconductor device that has been described using first and second embodiments is generated by an information processing device that executes a logic configuration software program.

FIG. 21 illustrates an example of a hardware configuration of the information processing device. An information processing device 210 has a processor 211, an input section 212, an output section 213, a storage section 214, and a drive device 215. The processor 211 stores, in the storage section 214, layout/interconnection software input to the input section 212, a circuit description language such as C language description or hardware description language (HDL) for designing integrated circuits, and truth table data generated by execution of the above software. Also, the processor 211 performs the following layout/interconnection process on the circuit description stored in the storage section 214 by executing the layout/interconnection software and outputs the truth table data to the output section 213. The reconfigurable semiconductor device 20 (not depicted in FIG. 21) can be connected to the output section 213, and the truth table data generated as a result of the logic configuration process by the processor 211 is written to the reconfigurable semiconductor device 20 via the output section 213. The output section 213 may be connected to an external network. In this case, the logic configuration software program is sent and received via the network. The drive device 215 is a device that reads from and writes to a storage medium 217 such as digital versatile disc (DVD) and flash memory. The drive device 215 includes a motor for rotating the storage medium 217, a head for reading data from and writing data to the storage medium 217, and so on. It should be noted that the storage medium 217 can store a logic configuration program or truth table data. The drive device 215 reads the program from the set storage medium 217. The processor 211 stores the program or truth table data read by the drive device 215 in the storage section 214.

As the truth table data is read by the semiconductor device 20, functionality as a logic element and/or a connection element is constructed by specific means that coordinates the truth table data and hardware resources. Also, it can be said that the truth table data is data that has a structure indicating a logic structure called truth table.

The embodiments described above were merely cited as typical examples. Combination, modification, and variation of elements forming each of the embodiments are apparent to a person skilled in the art. It is apparent that a person skilled in the art can modify the above embodiments in various ways without departing from the principle of the present invention as recited in the claims. In particular, it is possible, as a change to the embodiments, to change a bidirectional MLUT to multidirectional MLUT operation in MRLD's logic operation or connection operation.

REFERENCE SIGNS LIST

1 MRLD chip
2 Resin
3 Interposer substrate
4 External terminals
10 Analog section
11 Address selectors
12 input/output buffers
13 Data selectors
20 MRLD
30 MLUT
31 Memory cell units
40 Storage elements
50 Processor
60 MLUT array
101 A/D conversion section
102 Unit conversion circuits
110 Negative logical sum circuits
120 Logical sum circuits
130 Exclusive logical sum circuit
140 Delay circuits
150 Flip-flop
160 Inverter
170 D latch

The invention claimed is:

1. A reconfigurable semiconductor device comprising:
a plurality of logic sections that are connected to each other by an address line or a data line; and
an analog section including a plurality of input/output sections and an output amplifier, wherein
each of the logic sections includes
a plurality of address lines,
a plurality of data lines,
a memory cell unit, and
an address decoder adapted to decode an address signal and output a decoded signal to the memory cell unit, and
the plurality of logic sections and the analog section are mounted in a same chip package.

2. The reconfigurable semiconductor device of claim 1, further comprising:
a processor, wherein
the plurality of logic sections, the analog section, and the processor are connected to each other via a bus, and
as configuration data is written to the memory cell unit, the plurality of logic sections reconfigure a logic circuit and execute part of functionality of the processor by the configuration data.

3. The reconfigurable semiconductor device of claim 2, wherein the processor retains the configuration data and outputs the retained configuration data to the plurality of logic sections to reconfigure the plurality of logic sections.

4. The reconfigurable semiconductor device of claim 1, wherein the memory cell unit controls or sets the analog section as an interconnection element and/or a logic element configured by truth table data.

5. The reconfigurable semiconductor device of claim 4, wherein
the analog section includes a first digital input, a second digital input, a first amplifier, and a second amplifier, and
the truth table data connects one of the first digital input or the second digital input, and one of the first amplifier or the second amplifier.

6. The reconfigurable semiconductor device of claim 1, wherein
the analog section includes a digital input/output, a level shifter circuit, and an amplifier, and
an analog line and an output of the level shifter circuit are connected, and the data line and an input of the amplifier are connected.

7. The reconfigurable semiconductor device of claim 1, wherein the memory cell unit operates as a multi-lookup table.

8. The reconfigurable semiconductor device of claim 1, wherein
each of the logic sections includes
a plurality of address lines,
a plurality of data lines,
a clock signal line adapted to receive a system clock signal,
a first memory cell unit and a second memory cell unit adapted to operate in synchronism with a clock signal, a first address decoder adapted to decode an address signal and output a decoded signal to the first memory cell unit, a second address decoder adapted to decode an address signal and output a decoded signal to the second memory cell unit, and an address transition detection section adapted to generate an internal clock signal and output the internal clock signal to the first memory cell unit when a transition of an address signal input from the plurality of address lines is detected, the first memory cell unit operates in synchronism with the internal clock signal, and the second memory cell unit operates in synchronism with the system clock signal.

9. The reconfigurable semiconductor device of claim 8, wherein a data line connected to the first memory cell unit and a data line connected to the second memory cell unit are connected to each other to output a logical sum, and if one of the first memory cell unit or the second memory cell unit is not used, 0s are written for all to an unused memory cell unit.

10. The reconfigurable semiconductor device of claim 8, further comprising:

a third memory cell unit and a fourth memory cell unit adapted to operate in synchronism with a clock signal;

a third address decoder adapted to decode an address signal and output a decoded signal to the third memory cell unit; and a fourth address decoder adapted to decode an address signal and output a decoded signal to the fourth memory cell unit, wherein the third memory cell unit operates in synchronism with the internal clock signal, the fourth memory cell unit operates in synchronism with the system clock signal, the first address decoder and the second address decoder decode an address input from part of the plurality of address lines, and the third address decoder and the fourth address decoder decode an address input from other part of the plurality of address lines.

11. The reconfigurable semiconductor device of claim 10, storing truth table data configured not to generate a logic operation that spreads over the first memory cell unit and the third memory cell unit as an inhibit logic.

12. A control method of a reconfigurable semiconductor device, the reconfigurable semiconductor device comprising:

a plurality of logic sections that are connected to each other by an address line or a data line; and an analog section including a plurality of input/output sections and an output amplifier, wherein each of the plurality of logic sections includes a plurality of address lines, a plurality of data lines, a memory cell unit, and an address decoder adapted to decode an address signal and output a decoded signal to the memory cell unit, the plurality of logic sections and the analog section are mounted in a same chip package, the analog section has a first digital input, a second digital input, a first amplifier, and a second amplifier, each of the plurality of logic sections includes a plurality of address lines, a plurality of data lines, a clock signal line adapted to receive a system clock signal, a first address decoder, and a first memory cell unit having a plurality of memory cells and adapted to operate in synchronism with a clock signal, the first address decoder decodes the address signal and outputs a decoded signal to the first memory cell unit, and truth table data retained by the first memory cell unit connects one of the first digital input or second digital input, and one of the first amplifier and the second amplifier.

13. The control method of a reconfigurable semiconductor device of claim 12, wherein each of the plurality of logic sections includes:

a second address decoder, a second memory cell unit including a plurality of memory cells and adapted to operate in synchronism with a clock signal, an address transition detection section adapted to generate an internal clock signal and output the internal clock signal to the first memory cell unit when a transition of an address signal input from the plurality of address lines is detected, the second address decoder decodes the address signal and outputs a decoded signal to the second memory cell unit, the first memory cell unit operates in synchronism with the internal clock signal, and the second memory cell unit operates in synchronism with the system clock signal.

14. The control method of a reconfigurable semiconductor device of claim 13, further comprising:

a third memory cell unit and a fourth memory cell unit adapted to operate in synchronism with a clock signal;

a third address decoder adapted to decode an address signal and output a decoded signal to the third memory cell unit; and a fourth address decoder adapted to decode an address signal and output a decoded signal to the fourth memory cell unit, wherein the third memory cell unit operates in synchronism with the internal clock signal, the fourth memory cell unit operates in synchronism with the system clock signal, the first address decoder and the second address decoder decode an address input from part of the plurality of address lines, and the third address decoder and the fourth address decoder decode an address input from other part of the plurality of address lines.

15. The reconfigurable semiconductor device of claim 12, wherein the memory cell unit stores truth table data that configures an interconnection element and/or a logic element to operate as a multi-lookup table.

16. A non-transitory computer-readable medium having stored thereon computer-executable instructions that, when executed by a processor, cause a reconfigurable semiconductor device to execute operations, the operations comprising:

in the reconfigurable semiconductor device that comprises:

a plurality of logic sections connected to each other by an address line or a data line; and an analog section comprising a first digital input, a second digital input, a first amplifier, and a second amplifier, wherein each of the plurality of logic sections includes:
a plurality of address lines,
a plurality of data lines,
a clock signal line configured to receive a system clock signal,
a memory cell unit, comprising a plurality of memory cells, configured to operate in synchronism with the system clock signal, and
an address decoder configured to decode an address signal to generate a decoded signal and output the decoded signal to the memory cell unit, wherein the plurality of logic sections and the analog section are mounted on a chip package:

establishing, a connection between one of the first digital input or the second digital input and one of the first amplifier or the second amplifier, based on truth table data in the memory cell unit.

17. The non-transitory computer-readable medium of claim 16, wherein the reconfigurable semiconductor device further comprises a storage medium.

\* \* \* \* \*